(12) United States Patent
Tripodi

(10) Patent No.: US 12,216,488 B2
(45) Date of Patent: Feb. 4, 2025

(54) SYSTEMS AND METHODS FOR ASYNCHRONOUS FINITE MACHINES

(71) Applicant: STMicroelectronics S.r.l., Agrate Brianza (IT)

(72) Inventor: Domenico Tripodi, Milan (IT)

(73) Assignee: STMicroelectronics S.r.l., Agrate Brianza (IT)

(*) Notice: Subject to any disclaimer, the term of this patent is extended or adjusted under 35 U.S.C. 154(b) by 317 days.

(21) Appl. No.: 17/507,545

(22) Filed: Oct. 21, 2021

(65) Prior Publication Data
US 2023/0129868 A1  Apr. 27, 2023

(51) Int. Cl.
*G06F 1/04* (2006.01)
*H03K 19/20* (2006.01)

(52) U.S. Cl.
CPC .............. *G06F 1/04* (2013.01); *H03K 19/20* (2013.01)

(58) Field of Classification Search
CPC .................................. G06F 1/04; H03K 19/20
See application file for complete search history.

(56) References Cited

U.S. PATENT DOCUMENTS

| | | | | |
|---|---|---|---|---|
| 9,780,644 | B1* | 10/2017 | Tapadia | H03K 19/0016 |
| 9,870,644 | B2* | 1/2018 | Ha | G06T 19/006 |
| 11,016,145 | B1* | 5/2021 | Lesser | G01R 31/31727 |
| 2010/0095056 | A1* | 4/2010 | Okada | G06F 13/1605 |
| | | | | 711/E12.001 |
| 2013/0307598 | A1* | 11/2013 | Chard | H02M 3/1582 |
| | | | | 327/161 |
| 2020/0026813 | A1* | 1/2020 | Hiraoglu | G06F 30/327 |
| 2022/0086020 | A1* | 3/2022 | Quinn | H04L 7/0012 |
| 2022/0286122 | A1* | 9/2022 | Berg | H03K 4/026 |
| 2023/0031303 | A1* | 2/2023 | Bordes | H03K 19/20 |

FOREIGN PATENT DOCUMENTS

JP    3872954 B2 *  1/2007 ....... G01R 31/31704

* cited by examiner

*Primary Examiner* — Hyun Soo Kim
(74) *Attorney, Agent, or Firm* — Slater Matsil, LLP

(57) ABSTRACT

A system including an asynchronous finite state machine that transitions from a first state to a second state in response to receiving a virtual-clock event signal. The system further includes a trigger circuit that asserts a trigger signal when a first-state asynchronous event signal is asserted while the asynchronous finite state machine is in the first state. The system further including a virtual clock-pulse circuit configured to generate the virtual-clock event signal after receiving the trigger signal.

21 Claims, 15 Drawing Sheets

SYSTEMS AND METHODS FOR ASYNCHRONOUS FINITE MACHINES

TECHNICAL FIELD

The present invention relates generally to a systems and method for asynchronous finite machines.

BACKGROUND

The present invention relates to systems and methods for an asynchronous finite state machines that are triggered to transition between states.

SUMMARY

In accordance with an embodiment, a system includes an asynchronous finite state machine configured to transition from a first state to a second state in response to receiving a virtual-clock event; a trigger circuit including a first-state asynchronous event input to receive a first-state asynchronous event signal, the trigger circuit configured to communicate with the asynchronous finite state machine and assert a trigger signal in response to the first-state asynchronous event signal being asserted while the asynchronous finite state machine is in the first state; and a virtual clock-pulse circuit configured to receive the trigger signal and generate the virtual-clock event in response to the trigger signal being asserted.

In accordance with an embodiment, the asynchronous finite state machine is configured to transition from the second state to a third state in response to receiving the virtual-clock event and wherein the trigger circuit includes a second-state asynchronous event input to receive a second-state asynchronous event signal, the trigger circuit being configured to assert the trigger signal in response to the second-state asynchronous event signal being asserted while the asynchronous finite state machine is in the second state.

In accordance with an embodiment, trigger circuit includes a multiplexer that includes an output coupled with the virtual clock-pulse circuit to deliver the trigger signal, and a selection input that is coupled with an output of the asynchronous finite state machine, the trigger circuit being configured to provide the first-state asynchronous event signal to the output of the trigger circuit when the asynchronous finite state machine is in the first state and to provide the second-state asynchronous event signal to the output of the trigger circuit when the asynchronous finite state machine is in the second state.

In accordance with an embodiment, the virtual-clock event includes a first pulse and a second pulse.

In accordance with an embodiment, the asynchronous finite state machine is configured to transition from the first state to the second state in response to receiving the virtual-clock event by transitioning from the first state to an intermediate state on receiving the first pulse and transition from the intermediate state to the second state on receiving the second pulse.

In accordance with an embodiment, the trigger circuit is configured so that the trigger signal is de-asserted when the asynchronous finite state machine is in the intermediate state.

In accordance with an embodiment, the asynchronous finite state machine is configured to transition from the first state to the intermediate state on receiving a second-in-time active edge of the first pulse and configured to transition from the intermediate state to the second state on receiving a second-in-time active edge of the second pulse.

In accordance with an embodiment, the virtual clock-pulse circuit includes a monostable circuit to generate the first pulse and a pulse doubling circuit to generate the second pulse.

In accordance with an embodiment, the system further includes a de-glitch circuit including an input coupled with an output of the triggering circuit, the de-glitch circuit including an output coupled with the virtual clock-pulse circuit.

In accordance with an embodiment, a method includes triggering a virtual-clock event in response to a first-state asynchronous event signal being asserted; providing the virtual-clock event to an asynchronous finite state machine; and transitioning the asynchronous finite state machine from a first state to a second state in response to receiving the virtual-clock event.

In accordance with an embodiment, transitioning the asynchronous finite state machine from the first state to the second state includes transitioning the asynchronous finite state machine from the first state to an intermediate state and transitioning the asynchronous finite state machine from the intermediate state to the second state.

In accordance with an embodiment, providing the virtual-clock event to the asynchronous finite state machine includes providing a first pulse to the asynchronous finite state machine and providing a second pulse to the asynchronous finite state machine.

In accordance with an embodiment, a second-in-time active edge of the first pulse prompts the asynchronous finite state machine to transition from the first state to the intermediate state and a second-in-time active edge of the second pulse prompts the asynchronous finite state machine to transition from the intermediate state to the second state.

In accordance with an embodiment, the method further includes triggering a second virtual-clock event in response to receiving a second-state asynchronous event signal, the virtual-clock event including a first pulse and a second pulse; providing the second virtual-clock event to the asynchronous finite state machine; and transitioning the asynchronous finite state machine from the second state to a third state in response to receiving the virtual-clock event.

In accordance with an embodiment, a system includes an asynchronous finite state machine configured to transition from a first state to a first intermediate state in response to receiving a first pulse of a virtual-clock event while in the first state, transition from the first intermediate state to a second state in response to receiving a second pulse of the virtual-clock event while in the first intermediate state, transition from the second state to a second intermediate state in response to receiving the first pulse of the virtual-clock event while in the second state, and transition from the second intermediate state to a third state in response to receiving the second pulse of the virtual-clock event while in the second intermediate state. The system further including a trigger circuit including a first-state asynchronous event input to receive a first-state asynchronous event signal and a second-state asynchronous event input to receive a second-state asynchronous event signal, the trigger circuit configured to communicate with the asynchronous finite state machine and to assert a trigger signal in response to the first-state asynchronous event signal being asserted while the asynchronous finite state machine is in the first state and the trigger circuit being configured to assert the trigger signal when the second-state asynchronous event signal is asserted while the asynchronous finite state machine is in the second state; and a virtual clock-pulse circuit configured to receive the trigger signal and generate the virtual-clock event in response to the trigger signal being asserted.

In accordance with an embodiment, the trigger circuit is configured so that the trigger signal is de-asserted when the asynchronous finite state machine is in the first intermediate state, and the trigger circuit being configured so that the trigger signal is de-asserted when the asynchronous finite state machine is in the second intermediate state.

In accordance with an embodiment, the asynchronous finite state machine is configured to transition from the second state to the second intermediate state on receiving a second-in-time active edge of the first pulse and transition from the second intermediate state to the third state on receiving the second-in-time active edge of the second pulse.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Finite state machine ("FSM") transition from one state to another state depending on inputs to the finite state machine. Outputs from an FSM may depend on the state of the FSM (in the case of a Moore FSM) or on the state of the FSM and the inputs (in the case of a Mealy FSM). FSMs may also be either asynchronous or synchronous. A synchronous FSM is controlled or synchronized by a clock signal. An asynchronous FSM is characterized by the fact that state transitions are based on signal events and do not depend on a clock signal. For this reason, asynchronous FSM are sometimes called 'event-driven' FSMs.

Figure 1:
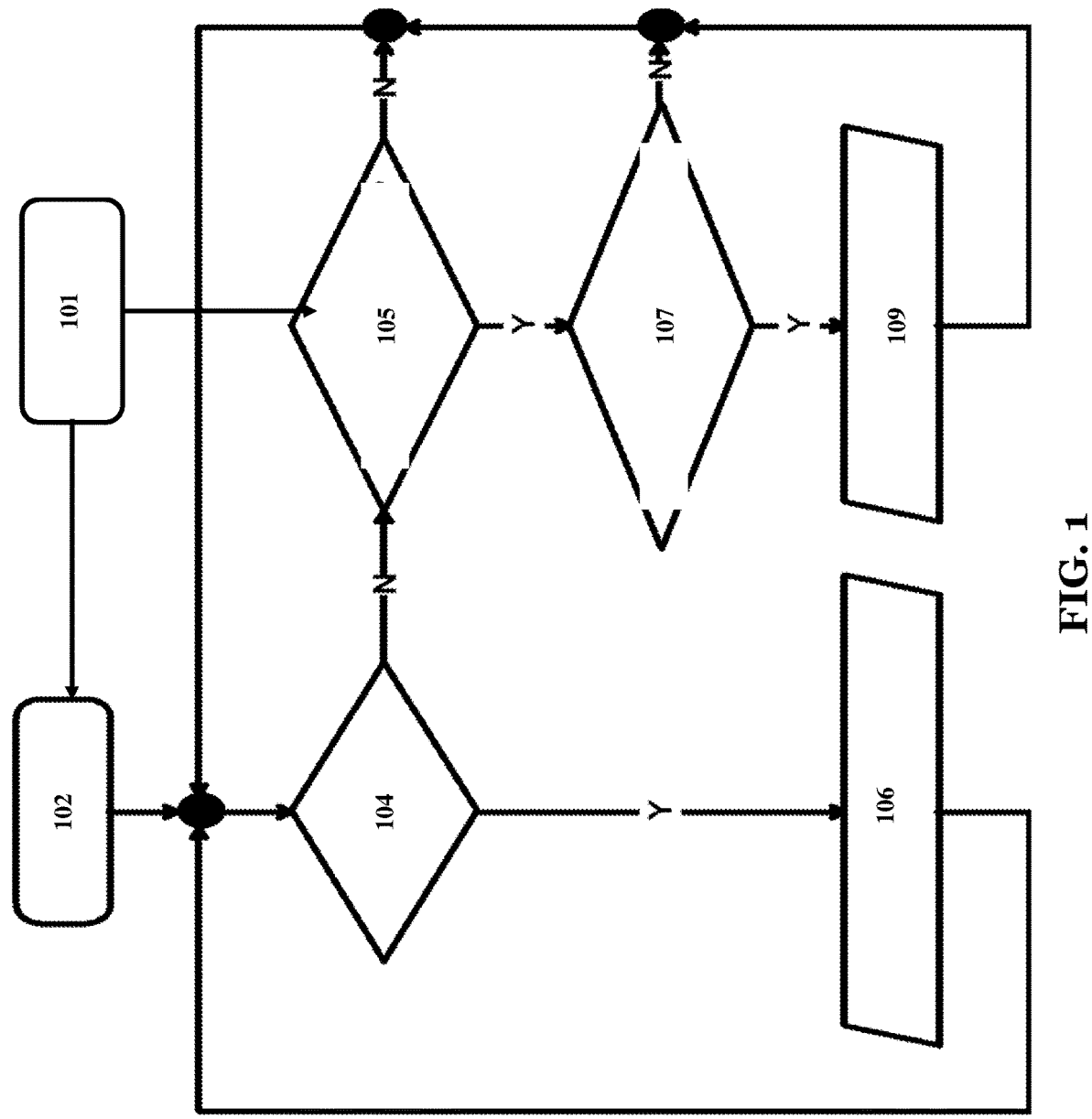
FIG. 1 depicts a flowchart illustrating operation of synchronous FSM.

FIG. 1 depicts a flowchart illustrating operation of synchronous FSM.

As shown in FIG. 1, a synchronous FSM begins at a step 102. A clock 101 provides clock pulses to the synchronous FSM. At a step 104, it is determined whether an active reset condition has been met. If the active reset condition is met, the actual state of the synchronous FSM is set to the initial state of the synchronous FSM at step 106. After step 106 has been completed, the process is returned to step 102.

If an active reset condition is not met at step 104, it is determined whether the clock is at an active edge at step 105. If the clock signal is not at an active edge, the process returns to the start step 102. If the clock signal is at an active edge at step 105, it is determined at step 107 whether any transition has been enabled. If not, the process returns to the step 102 to start the process again. If a transition is enabled at step 107, then the actual state change is executed at step 109. And, the process returns to step 102 to start over again. As apparent from FIG. 1, transitions in synchronous FSMs depend on clock events. This contrasts with operation of an asynchronous FSM.

Figure 2:
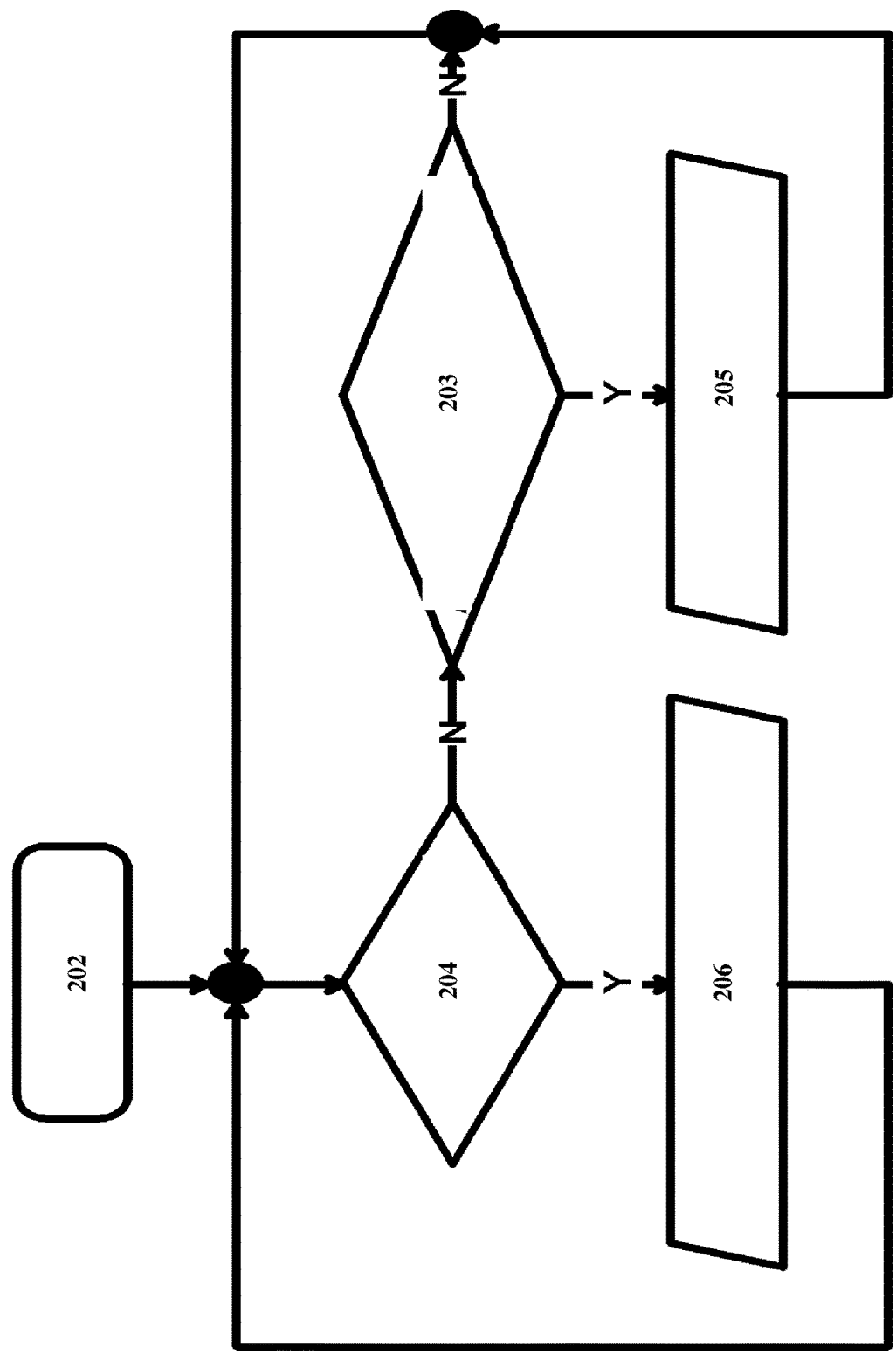
FIG. 2 depicts a flow chart illustrating operation of an asynchronous FSM.

FIG. 2 depicts a flow chart illustrating operation of an asynchronous FSM.

As shown in FIG. 2, an asynchronous FSM begins at a step 202. In contrast with a synchronous FSM, there is no clock in this asynchronous FSM. At a step 204, it is determined whether an active reset condition has been met. If the active reset condition is met, the actual state of the asynchronous FSM is set to the initial state of the asynchronous FSM at step 206. After step 206 has been completed, the process is returned to step 202.

If there is no reset at step 204, the process proceeds to step 203 where it is determined whether a transition has been enabled. If a transition is enabled, the transition (actual state change) is executed at step 205. After execution of the transition, the process returns to step 202. If no transition is enabled at step 203, the process returns to step 202.

Traditionally, most digital circuits designed and fabricated today work with synchronous logic where a global clock signal is distributed throughout the circuit. This clock signal imposes timing budget, and timing constraints. Synchronous FSMs store state changes in memory elements such as flip-flops or latches. Data is synchronized by a clock signal. And, as will be appreciated, the output of a flip-flop is constant until a clock pulse is applied to an input of the flip-flop whereupon the input of the flip-flop is latched into its output.

In an asynchronous circuit there may not be a common and discrete time. The speed of the circuit is thus not dependent on clock events. The speed of the device may be limited by the propagation delay among logic gates. Asynchronous circuit may use handshaking protocols between components to perform synchronization.

In recent times, asynchronous circuits have become increasingly popular due to some advantages they offer over synchronous circuits. Asynchronous circuits can provide solutions that consume less power than their synchronous counterparts. This is because asynchronous circuits may remain quiescent more than synchronous circuits. Clock pulses themselves also consume power and dissipates heat.

Further, asynchronous circuits may operate faster than synchronous circuits. Synchronous circuits may have a response time that is determined by the clock speed rather than the propagation delay of the components of the circuit.

Synchronous circuits may also suffer from high emission of electro-magnetic noise (EMI). EMI interference may be present at frequencies close to the clock frequency and harmonics. However, this issue may be mitigated in an asynchronous circuit where no clock pulse is present.

Known asynchronous architectures also have limitations. Asynchronous control logic that implements handshaking may require design of specific ad-hoc modules consuming resources and requiring overhead. For example, this can increase the time to market and consume limited space on a silicon device. Further, existing CAD and ATPG (automatic test pattern generation) tools cannot easily be adapted for implementation with asynchronous architecture. As a result, automatic test pattern generation may require the usage of dedicated design methodology and flow and the design of specific ad-hoc modules also for testing. Therefore, there remains a need implement an asynchronous FSM that is compatible with existing resources to take advantage of the benefits offered by asynchronous implementation and limits or eliminates the drawbacks.

Figure 3:
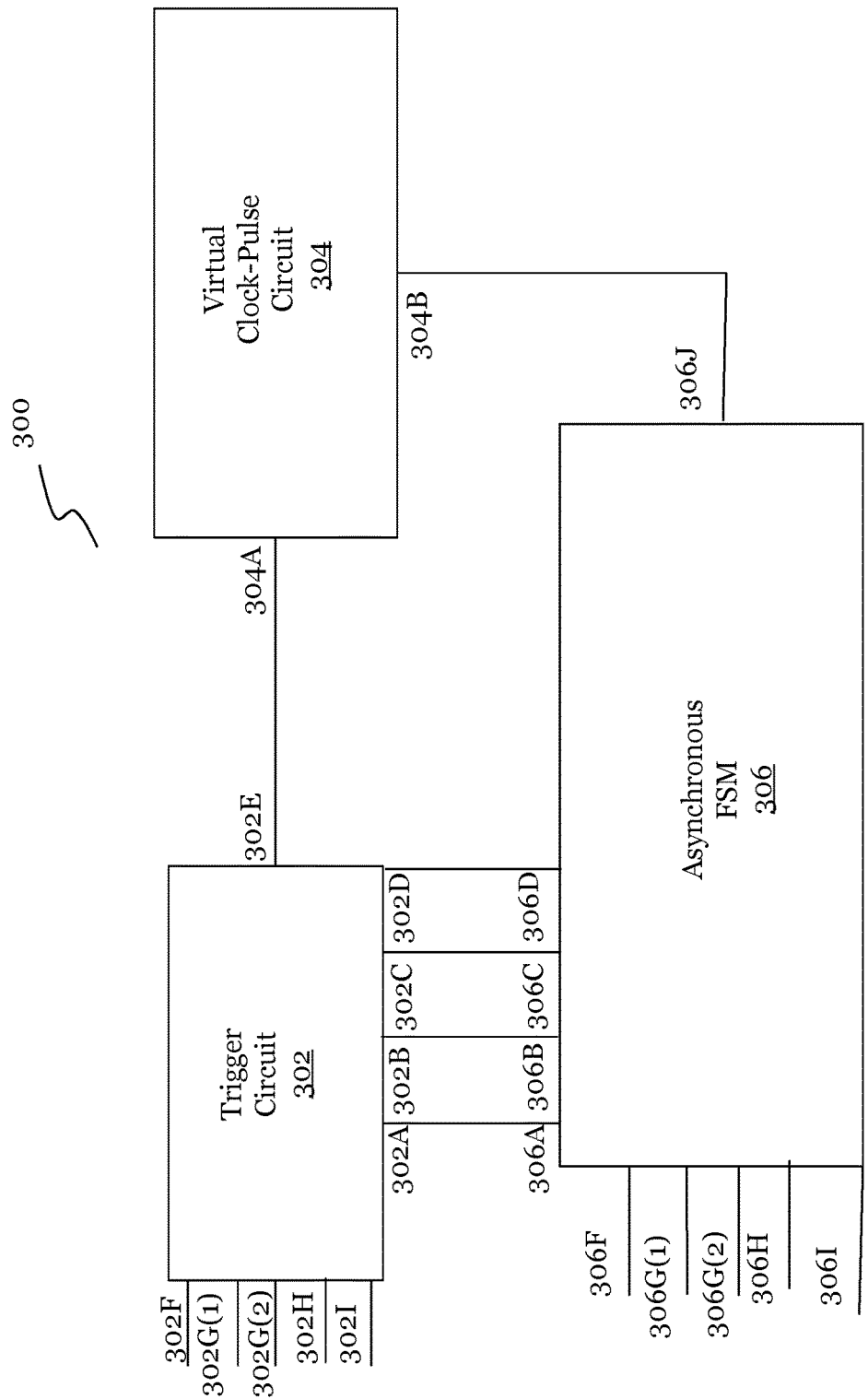
FIG. 3 depicts an asynchronous FSM system in accordance with embodiments.

FIG. 3 depicts an asynchronous FSM system 300 in accordance with embodiments.

The asynchronous FSM system 300 may comprise a trigger circuit 302 coupled with a virtual clock-pulse circuit 304, which is coupled with an asynchronous FSM 306.

The asynchronous FSM 306 may be configured to transition among various states. For example, the asynchronous FSM 306 may be configured to transition from a first state to a second state. As will be appreciated, the number of states and the order of any transitions may vary in various embodiments of the asynchronous FSM 306. For example, the asynchronous FSM 306 may comprise a first state, a second state, a third state and a fourth state. The asynchronous FSM 306 can include any number of different states in different embodiments. An asynchronous FSM may be implemented, by way of non-limiting examples, by combining logic gates and memory elements, such as SR latches or C-elements or flip-flops that don't require a clock input.

Known implementations of asynchronous FSMs do not utilize a clock signal and the state of the circuit changes as soon as the inputs change. They are self-timed circuits with modules that communicate each other using a handshake protocol. This contrasts with embodiments of the asynchronous FSM 306 of the present disclosure which utilizes a virtual clock signal from a trigger signal. This allows the asynchronous FSM 306 to be managed as if it was a synchronous FSM and thus combine a variety of advantages of asynchronous state machines (high speed, low power consumption, improved noise immunity and electromagnetic compatibility, greater tolerance to process variations and external voltage fluctuations) with the advantages of synchronous FSMs (less severity of race condition issue and ease in implementing and testing with standard and automatic design tools).

The state transitions may occur based on the inputs to the asynchronous FSM 306. For example, the asynchronous FSM 306 may transition from the first state to the second state depending on inputs to the asynchronous FSM 306. The asynchronous FSM 306 may transition from the second state to the third state or the fourth state depending on inputs. The asynchronous FSM 306 may transition from the third state or the fourth state back to the second state depending on inputs. Theses example should not be taken to limit the number of states, order of transitions, or path of transitions of an asynchronous FSM 306. As will be appreciated, an asynchronous FSM 306 may comprise vary any number of states or order of transitions.

The asynchronous FSM 306 may comprise a Moore machine in various embodiments. The asynchronous FSM 306 may comprise a Mealy machine in various embodiments. Transitions may depend on inputs to the asynchronous FSM 306 in various embodiments. In various embodiments, transitions maybe depend on inputs to the asynchronous FSM 306 and the state of the asynchronous FSM 306.

The asynchronous FSM 306 may also output data indicating the state of the asynchronous FSM 306. Outputs for individual states may be joined on a one-hot encoded bus. As will be appreciated, the asynchronous FSM 306 may also comprise an output, or outputs, that provides data or signals in addition to data or signals indicating the state of the asynchronous FSM 306, in various embodiments.

As an example, in various embodiments, the asynchronous FSM 306 may comprise a first output 306A, a second output 306B, a third output 306C and a fourth output 306D. The first output 306A may output a signal that is asserted when the asynchronous FSM 306 is in a first state. The second output 306B may output a signal that is asserted when the asynchronous FSM 306 is in a second state. The third output 306C may output a signal that is asserted when the asynchronous FSM 306 is in a third state. The fourth output 306D may output a signal that is asserted when the asynchronous FSM 306 is in a fourth state.

Outputs of the asynchronous FSM 306 may be coupled with the trigger circuit 302. This may provide feedback to the trigger circuit 302 about the state of the asynchronous FSM 306. For example, the first output 306A of the asynchronous FSM 306 may be coupled with a first input 302A of the trigger circuit 302, the second output 306B of the asynchronous FSM 306 may be coupled with a second input 302B of the trigger circuit 302, the third output 306C of the asynchronous FSM 306 may be coupled with a third input 302C of the trigger circuit 302, and the fourth output 306D of the asynchronous FSM 306 may be coupled with a fourth input 302D of the trigger circuit 302.

In various embodiments, the trigger circuit 302 may be configured to generate a trigger signal. The trigger signal may be asserted at a trigger-signal output 302E. The trigger-signal output 302E may be coupled with the virtual clock-pulse circuit 304. The trigger-signal output 302E of the trigger circuit 302 may be coupled to a trigger-signal input 304A of the virtual clock-pulse circuit 304.

The trigger signal may be asserted depending on the inputs of the trigger circuit 302. The trigger circuit 302 may comprise one or more inputs where it receives signals. The trigger circuit 302 may comprise internal logic to assert the trigger signal depending on the inputs. The trigger circuit 302 may be configured so that the trigger signal is asserted in response to any variety of inputs, or combination of inputs. The input, or combinations of inputs, needed to generate the trigger signals may correspond to the inputs that prompt transitions. In other words, the trigger circuit 302 may be configured so that it generates a trigger signal any time the asynchronous FSM 306 is to transition between states.

In various embodiments, the trigger circuit 302 may have various inputs. The number of inputs may vary in embodiments. In various embodiments, the trigger circuit 302 may comprise a multiplexer. Feedback from the asynchronous FSM 306 about the state of the asynchronous FSM 306 may be used to select which input to the trigger circuit 302 is propagated at the trigger signal. For example, the trigger circuit 302 may receive a signal from the asynchronous FSM 306 when it is in a first state. When this signal is received, the trigger circuit 302 may be configured to propagate corresponding input as the trigger signal. This input signal may be asserted when a first-state asynchronous event occurs, which then may cause the trigger circuit 302 to generate a trigger signal. For example, the first-state asynchronous event signal may be provided to first-state asynchronous event input 302F. When a first state signal provided to first input 302A is asserted, the trigger circuit 302 may be configured to output the first-event asynchronous signal to the trigger-signal output 302E. As will be appreciated, inputs to the trigger circuit 302 and outputs from asynchronous FSM 306 may be carried on a bus.

By way of a non-limiting example, the trigger circuit 302 may comprise a first-state asynchronous event input 302F. The trigger circuit 302 may also comprise a second-state asynchronous event input 302G(1) and another second-state asynchronous event input 302G(2). The trigger circuit 302 may also comprise a third-state asynchronous event input 302H. The trigger circuit 302 may also comprise a fourth-state asynchronous event input 302I. The trigger circuit 302 may receive signals communicating the state of the asynchronous FSM 306 (for example at first input 302A, second input 302B, third input 302C, and fourth input 302D). In various embodiments, when the asynchronous FSM 306 is in the first state, a first-event asynchronous signal coupled with the first-state asynchronous event input 302F may be propagated at the trigger-signal output 302E. Thus, when the first-state asynchronous event signal is asserted, a trigger signal will be generated at the trigger-signal output 302E while the asynchronous FSM 306 is in the first state. Similarly, a trigger signal may be generated when the asynchronous FSM 306 is in the third state and a third-state asynchronous event signal coupled with the third-state asynchronous event input 302H is asserted. And, a trigger signal may be generated when the asynchronous FSM 306 is in the fourth state and a fourth-state asynchronous event signal coupled with the fourth-state asynchronous event input 302I is asserted. As will be appreciated, a trigger circuit 302 may be configured to generate trigger signals under many different circumstances. For example, the trigger circuit 302 may be configured to generate a trigger signal when the asynchronous FSM 306 is in second state and a signal received at either the second-state asynchronous event input 302G(1) is asserted or a signal received at the other second-state asynchronous event input 302G(2) is asserted. The trigger circuit 302 may be configured to generate a trigger signal based on any input or combination of inputs. And, the output may also depend on the state of the asynchronous FSM 306. The trigger circuit 302 may implemented with logic gates in various embodiments. State-event Asynchronous signals (such as a first-state asynchronous event signal, second-state asynchronous event signal, etc.) may be provided from external components or other components part of the same system. As will be appreciated, they may be generated by any condition, or combination of conditions, desired to trigger state changes of an FSM. Circuitry providing state-event asynchronous signals may comprise any analog or digital integrated block of the system or application specific circuits.

Figure 4:
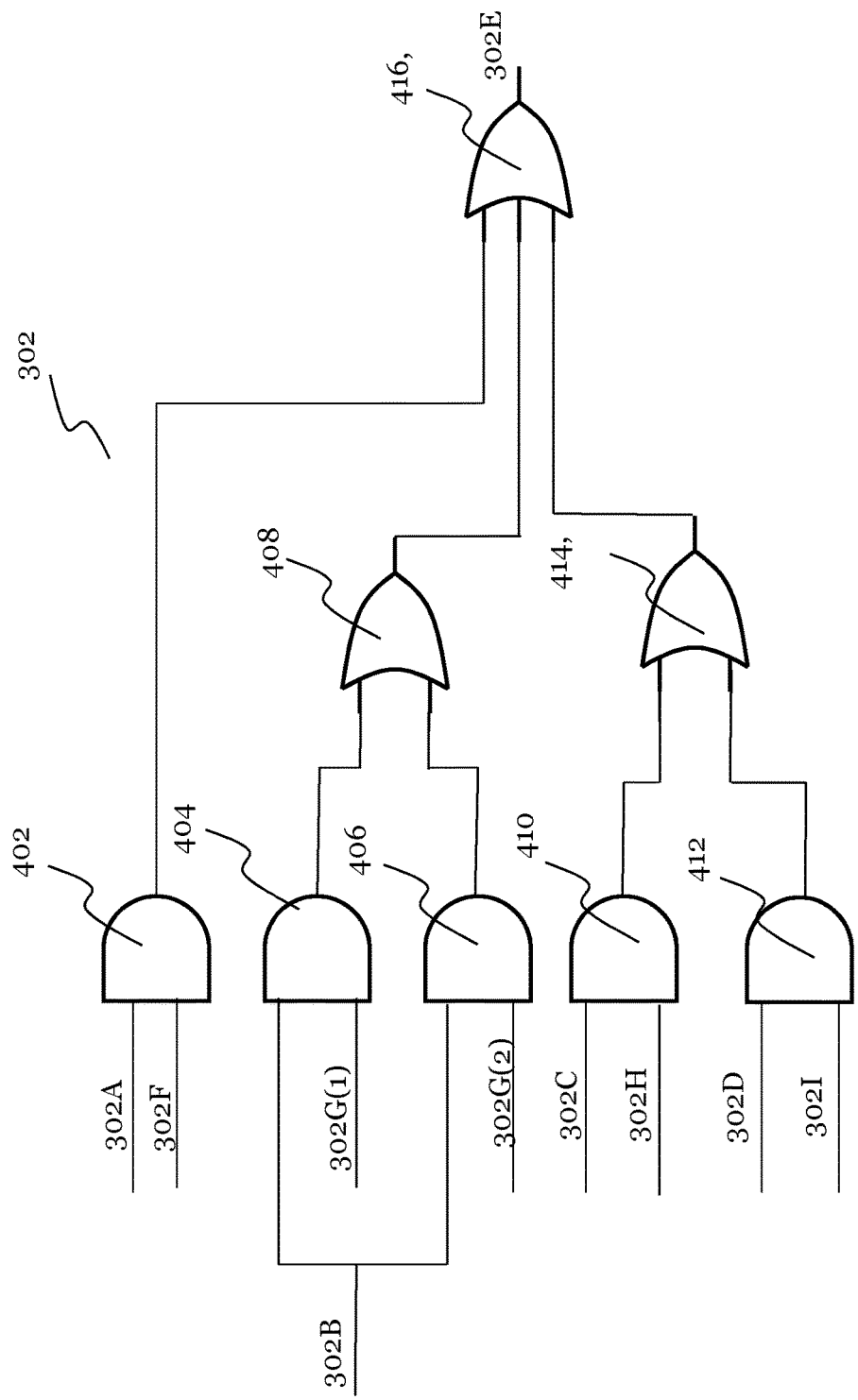
FIG. 4 depicts a trigger circuit consistent with embodiments.

FIG. 4 depicts a trigger circuit 302 consistent with embodiments.

In various embodiments, the first input 302A and the first-state asynchronous event input 302F may be input into an AND gate 402. The first input 302A may carry a signal that is asserted when the asynchronous FSM 306 is in the first state. And, the first-state asynchronous event input 302F may carry as signal that is asserted when a first-state asynchronous event occurs. Thus, the first-state asynchronous event signal will only pass the AND gate 402 when the asynchronous FSM 306 is in the first state.

The trigger circuit 302 may be configured to operate in multiple ways. For example, an asynchronous FSM 306 may be configured to transition from a given state in response to more than one type of event. The asynchronous FSM 306 may transition from a second state to a third state in response to one asynchronous event and the asynchronous FSM 306 may also be configured to transition from a second state to a fourth state in response to another asynchronous event. An asynchronous FSM 306 may transition from a first state to a second state on one asynchronous event, and from a first state to the second state on another asynchronous event. It will be appreciated that an asynchronous FSM 306 may be configured in any number of ways. And, the trigger circuit 302 may be configured so that a trigger signal is generated for each transition event.

Figure 5:
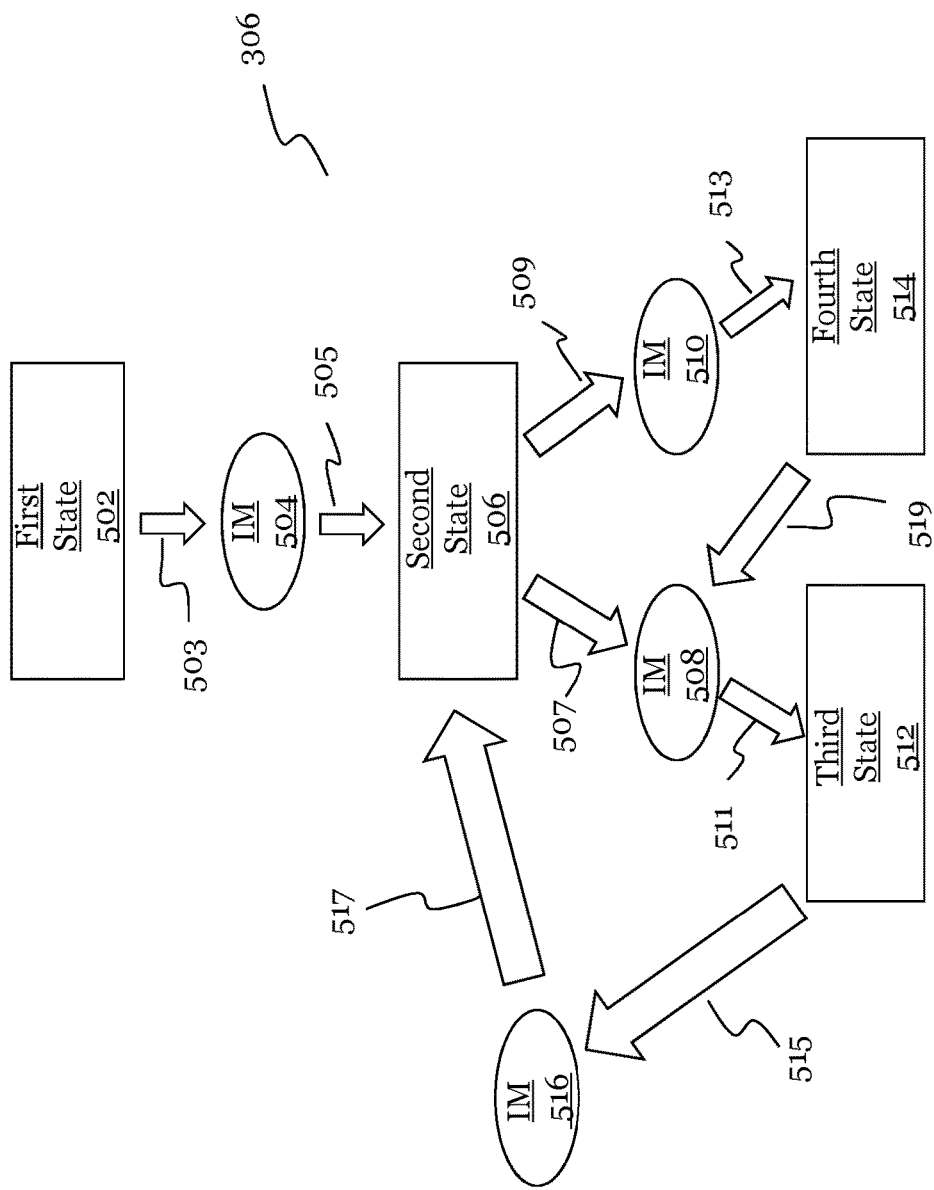
FIG. 5 depicts an example of asynchronous FSM comprising an intermediate state in accordance with embodiments.

In various embodiments, as mentioned before, it may be desirable to have a trigger signal generated for more than one asynchronous event while the asynchronous FSM 306 is in a given state (for example, the second state). In an example, a second input 302B of the trigger circuit 302 may receive a signal from the asynchronous FSM 306 that is asserted when the asynchronous FSM 306 is in the second state. The second input 302B may be coupled input to an AND gate 404, and an AND gate 406. This may occur in embodiments wherein an asynchronous FSM 306 comprises a fork condition (as is depicted in FIG. 5). The AND gate 404 may also be coupled at an input with second-state asynchronous event input 302G(1) that receives a first second-state asynchronous event signal (that is asserted when the first second-state asynchronous event occurs). The AND gate 406 may also be coupled at an input with second-state asynchronous event input 302G(2) that receives a second second-state asynchronous event signal (that is asserted when the second second-state asynchronous event signal occurs). The output from AND gate 404 and output from AND gate 406 may be coupled with an OR gate 408. This presents one example how a trigger signal may be generated in response to more than one asynchronous event signal for a given state of an asynchronous FSM 306. However, this example should not be construed to limit application of the present disclosure. Other embodiments may employ other means.

Continuing with FIG. 4, in various embodiments, the third input 302C and the third-state asynchronous event input 302H may be input into an AND gate 410. The third input 302C may carry a signal that is asserted when the asynchronous FSM 306 is in the third state. And, the third-state asynchronous event input 302H may carry as signal that is asserted when a third-state asynchronous event occurs. Thus, in this example, the third-state asynchronous event signal will only pass the AND gate 410 when the asynchronous FSM 306 is in the third state.

In various embodiments, the fourth input 302D and the fourth-state asynchronous event input 302I may be input into an AND gate 412. The fourth input 302D may carry a signal that is asserted when the asynchronous FSM 306 is in the fourth state. And, the fourth-state asynchronous event input 302I may carry as signal that is asserted when a fourth-state asynchronous event occurs. Thus, the fourth-state asynchronous event signal will only pass the AND gate 412 when the asynchronous FSM 306 is in the fourth state. Output from the AND gate 410 and output from AND gate 412 may be input to OR gate 414. Output from AND gate 402, output from OR gate 408, and OR gate 414 may be input to OR gate 416.

Returning to FIG. 3, once a trigger signal is generated by the trigger circuit 302, it may be provided to virtual clock-pulse circuit 304. The virtual clock-pulse circuit 304 may receive a trigger signal at trigger-signal input 304A. The virtual clock-pulse circuit 304 may be configured to generate a virtual-clock event after receiving the trigger signal. An output 304B of the virtual clock-pulse circuit 304 may provide the virtual-clock event. The virtual-clock event may be provided to the asynchronous FSM 306 at a clock input 306J. In various embodiments, the output of the virtual clock-pulse circuit 304 may be toggled from one state to another state in response to receiving a trigger signal.

In various embodiments, the asynchronous FSM 306 may be configured to transition states in response to a virtual-clock event. The virtual-clock event may comprise a virtual pulse. The asynchronous FSM 306 may be configured to transition states at a rising edge or falling edge of a virtual pulse. In various embodiments, the asynchronous FSM 306 may transition states based only on a virtual-clock event without other inputs. This may occur in embodiments of an asynchronous FSM 306 that do not comprise a fork condition.

In various embodiments, the asynchronous FSM 306 may also receive additional inputs that determine whether the asynchronous FSM 306 transitions from one state to another. The asynchronous FSM 306 may comprise any number of inputs, and transitions may depend on the inputs, and combinations of inputs as well as the virtual-clock events. Transitions of the asynchronous FSM 306 may also depend on the state of the asynchronous FSM 306.

In a non-limiting example, the asynchronous FSM 306 may comprise a first-state asynchronous event input 306F, a second-state asynchronous event input 306G(1), a second-state asynchronous event input 306G(2), third-state asynchronous event input 306H, and a fourth-state asynchronous event input 306I. The first-state asynchronous event input 306F, second-state asynchronous event input 306G(1), the second-state asynchronous event input 306G(2), third-state asynchronous event input 306H, and fourth-state asynchronous event input 306I may receive the same signals as the first-state asynchronous event input 302F, the second-state asynchronous event input 302G(1), the second-state asynchronous event input 302G(2), third-state asynchronous event input 302H, and fourth-state asynchronous event input 302I. The asynchronous FSM 306 may be configured to transition on a virtual-clock event that occurs while a corresponding asynchronous input signal is asserted. For examples, a transition from the first state to the second state may require both reception of a virtual-clock event at clock input 306J together with an asserted first-state asynchronous event at first-state asynchronous event input 306F. Having a transition conditioned in this way may allow the asynchronous FSM 306 to manage fork conditions and priority between events but also to avoid a transitory variation in an input signal to the trigger circuit 302 to cause a transition. Thus, a first-state asynchronous event signal asserted at the first-state asynchronous event input 302F of the trigger circuit 302 may need to be maintained until a virtual-clock event is propagated to the asynchronous FSM 306 in order to cause the asynchronous FSM 306 to transition to the second state. The asynchronous event thus, may need to be maintained at least as long as it takes for the trigger signal to prompt the virtual clock-pulse circuit 304 to generate a virtual-clock event and propagate the virtual-clock event to the asynchronous FSM 306.

In various embodiments, it may be advantageous for the virtual clock-pulse circuit 304 to generate a double clock pulse in response to a trigger signal. This may be desirable to manage the handshake protocol with respect to trigger circuit 302 and to correctly complete the states transition. This may allow starting-state signal throughout the asynchronous FSM system 300 to return to zero during transitions before assertion of arrival-state signal. This may allow for subsequent triggers of the virtual clock-pulse circuit 304 that may otherwise be prevented. In various embodiments, an asynchronous FSM 306 may transition to an intermediate state (or "no-state zone") between states. In the intermediate state (or states) the asynchronous FSM 306 may be configured not provide an output indicating its state. A virtual-clock event may comprise a first pulse that causes transition from a one state to an intermediate state. And, a second pulse may cause a transition to a subsequent state.

FIG. 5 depicts an asynchronous FSM 306 comprising an intermediate state in accordance with embodiments.

In various embodiments, the asynchronous FSM 306 may transition from a first state 502 to a second state in response to a virtual-clock event (assuming other conditions for a transition are met, such as first-state asynchronous event). This transition may comprise at a first step 503, in response to a first pulse of a virtual-clock event, transitioning to an intermediate state 504. This may be triggered by a second active edge of a first pulse of a virtual-clock event (rising edge in various embodiments or falling edge in various embodiments). While in the first state, the asynchronous FSM 306 may output data indicating that it is in the first state (such as by asserting a signal provided to first output 306A). While, in the intermediate state, all outputs provided to the trigger circuit 302 that indicate the state of the asynchronous FSM 306 may be returned to zero (or other de-asserted state). The asynchronous FSM 306 may be configured so that a transition to the second state 506 may comprise a second step 505. where the asynchronous FSM 306 transitions from the intermediate state 504 to a second state 506. This may be triggered by a second active edge of a second pulse of a virtual-clock event (rising edge in various embodiments or falling edge in various embodiments). Once in the second state, the asynchronous FSM 306 may output a signal that indicates that the asynchronous FSM 306 is in the second state. For example, by asserting a signal coupled to second output 306B.

In various embodiments, on a virtual-clock event, an asynchronous FSM 306 may transition from the second state 506 either to a third state 512 or a fourth state 514. This may depend on the event that triggers the transition. For example, a virtual-clock event triggered by a first second-state asynchronous event may cause a transition to the third state 512. And, a virtual-clock event triggered by a second second-state asynchronous event may cause a transition to the fourth state 514.

A transition from the second state 506 to the third state 512 may occur in two steps. At a first step 507, in response to a first virtual-clock pulse of a virtual-clock event, the asynchronous FSM 306 may transition from the second state 506 to an intermediate state 508. This may be triggered by a second active edge of a first pulse of a virtual-clock event (rising edge in various embodiments or falling edge in various embodiments). While in the intermediate state 508, outputs of the asynchronous FSM 306 that indicate the state of the asynchronous FSM 306 may be returned to zero (or other de-asserted state). At a second step 511 of the transition, which may occur on a second virtual-clock pulse of a virtual-clock event, the asynchronous FSM 306 may be configured to transition from the intermediate state 508 to the third state 512. This may be triggered by a second active edge of a second pulse of a virtual-clock event (rising edge in various embodiments or falling edge in various embodiments). Once in the third state, the asynchronous FSM 306 may output data indicating that the asynchronous FSM 306 is in the third state. For example, by asserting a signal coupled to third output 306C.

A transition from the second state 506 to the fourth state 514 may occur in two steps. At a first step 509, in response to a first virtual-clock pulse of a virtual event, the asynchronous FSM 306 may transition from the second state 506 to an intermediate state 510. This may be triggered by a second active edge of a first pulse of a virtual-clock event (rising edge in various embodiments or falling edge in various embodiments). While in the intermediate state 510, outputs of the asynchronous FSM 306 that indicate the state of the asynchronous FSM 306 may be returned to zero (or other de-asserted state). At a second step 513 of the transition, which may occur on a second virtual-clock pulse of a virtual-clock event, the asynchronous FSM 306 may be configured to transition from the intermediate state 510 to the fourth state 514. This may be triggered by a second active edge of a second pulse of a virtual-clock event (rising edge in various embodiments or falling edge in various embodiments). Once in the fourth state, the asynchronous FSM 306 may output data indicating that the asynchronous FSM 306 is in the fourth state. For example, by asserting a signal coupled to fourth output 306D.

In various embodiments the intermediate state 508 and intermediate state 510 may be combined into a single state. Transitions out a combined intermediate state may depend on additional input that identifies which event triggered the virtual clock. In various embodiments the asynchronous FSM 306 may be configured to comprise a single intermediate state where transitions depend on additional inputs. Indeed, an asynchronous FSM 306 may be configured to behave in any number of ways in various embodiments.

Continuing with FIG. 5, in various embodiments, an asynchronous FSM 306 may be configured to transition from the third state 512 back to the second state in response to a virtual-clock event. These transitions may occur in two steps. At a first step 515 the asynchronous FSM 306 may transition from the third state 512 or to an intermediate state 516. This may be triggered by a second active edge of a first pulse of a virtual-clock event (rising edge in various embodiments or falling edge in various embodiments). Once in the intermediate state outputs indicating the state of the asynchronous FSM 306 may be returned to zero (or to any level that indicates it is not in the corresponding state). At a second step 517, the asynchronous FSM 306 may transition from the intermediate state 516 back to the second state 506. This may be prompted by a second virtual-clock pulse of a virtual-clock event. Once back in the second state 506, the asynchronous FSM 306 may again output indicating a signal that is in the second state. This may be triggered by a second active edge of a second pulse of a virtual-clock event (rising edge in various embodiments or falling edge in various embodiments). In various embodiments the intermediate state 504 and intermediate state 516 may be combined into a single state. In various embodiments, each final state may have a corresponding intermediate state.

In various embodiments, the asynchronous FSM 306 may be configured to transition from the fourth state 514 to the third state 512. This may occur in two steps. At a first step 519, the asynchronous FSM 306 may transition to the intermediate state 508. This may occur on a first virtual-clock pulse of a virtual-clock event. This may be triggered by a second active edge of a first pulse of a virtual-clock event (rising edge in various embodiments or falling edge in various embodiments). Then, at a second step 511 on a second virtual-clock pulse of a virtual-clock event, the asynchronous FSM 306 may transition from the intermediate state 508 to the third state 512.

As will be appreciated, the asynchronous FSM 306 depicted in FIG. 5 depicts just one of any number of potential configurations of an FSM. FIG. 5 is provided for explanatory purposes and should not be construed to limit the application of the present disclosure.

Figure 6A:
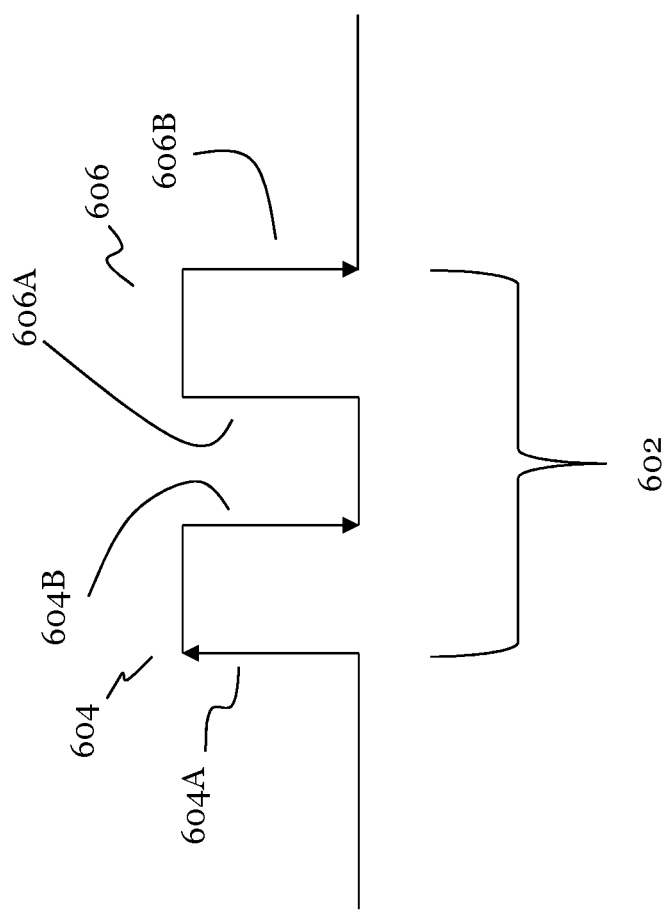
FIG. 6A depicts a virtual-clock event comprising two virtual-clock pulses that may used to transition an asynchronous FSM comprising intermediate states in accordance with embodiments.

FIG. 6A depicts a virtual-clock event comprising two virtual-clock pulses that may used to transition an asynchronous FSM 306 comprising intermediate states in accordance with embodiments.

A virtual-clock event 602 may comprise a first pulse 604 and a second pulse 606. In various embodiments the rising edge 604A of the first pulse 604 may be used for asynchronous data synchronization. The asynchronous FSM 306 may be configured so that it transitions from one state to an intermediate state on a falling edge 604B of the first pulse 604. The asynchronous FSM 306 may be configured so that it transitions from an intermediate state into a final state (for example a first state, second state) on a falling edge 606B of the second pulse 606.

In various embodiments, outputs indicating the state of the asynchronous FSM 306 may be kept at zero (or any de-asserted level) during the period between the falling edge 604B of the first pulse 604 and the falling edge 606B of the second pulse 606. This provides return to zero period for the asynchronous FSM system 300. In various embodiments, rising edges (instead of falling edges) may be used to trigger transitions if an inverted version of virtual-clock event 602 is used.

Figure 6B:
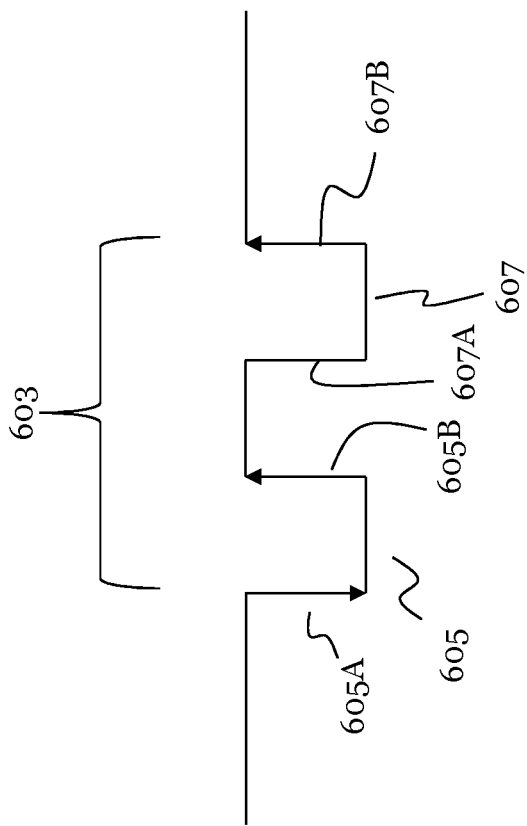
FIG. 6B depicts an in inverted virtual-clock event comprising two virtual-clock pulses that may used to transition an asynchronous FSM 306 comprising intermediate states in accordance with embodiments.

FIG. 6B depicts an in inverted virtual-clock event 603 comprising two virtual-clock pulses that may used to transition an asynchronous FSM 306 comprising intermediate states in accordance with embodiments.

An inverted virtual-clock event 603 may comprise a first pulse 605 and a second pulse 607. In various embodiments the falling edge 605A of the first pulse 605 may be used for asynchronous data synchronization. The asynchronous FSM 306 may be configured so that it transitions from one state to an intermediate state on a rising edge 605B of the first pulse 605. The asynchronous FSM 306 may be configured so that it transitions from an intermediate state into another state on a rising edge 607B of the second pulse 607.

In various embodiments, outputs indicating the state of the asynchronous FSM 306 may be kept at zero (or any de-asserted level) during the period between the rising edge 605B of the first pulse 605 and the rising edge 607B of the second pulse 607. This provides return to zero period for the asynchronous FSM system 300.

Figure 7A:
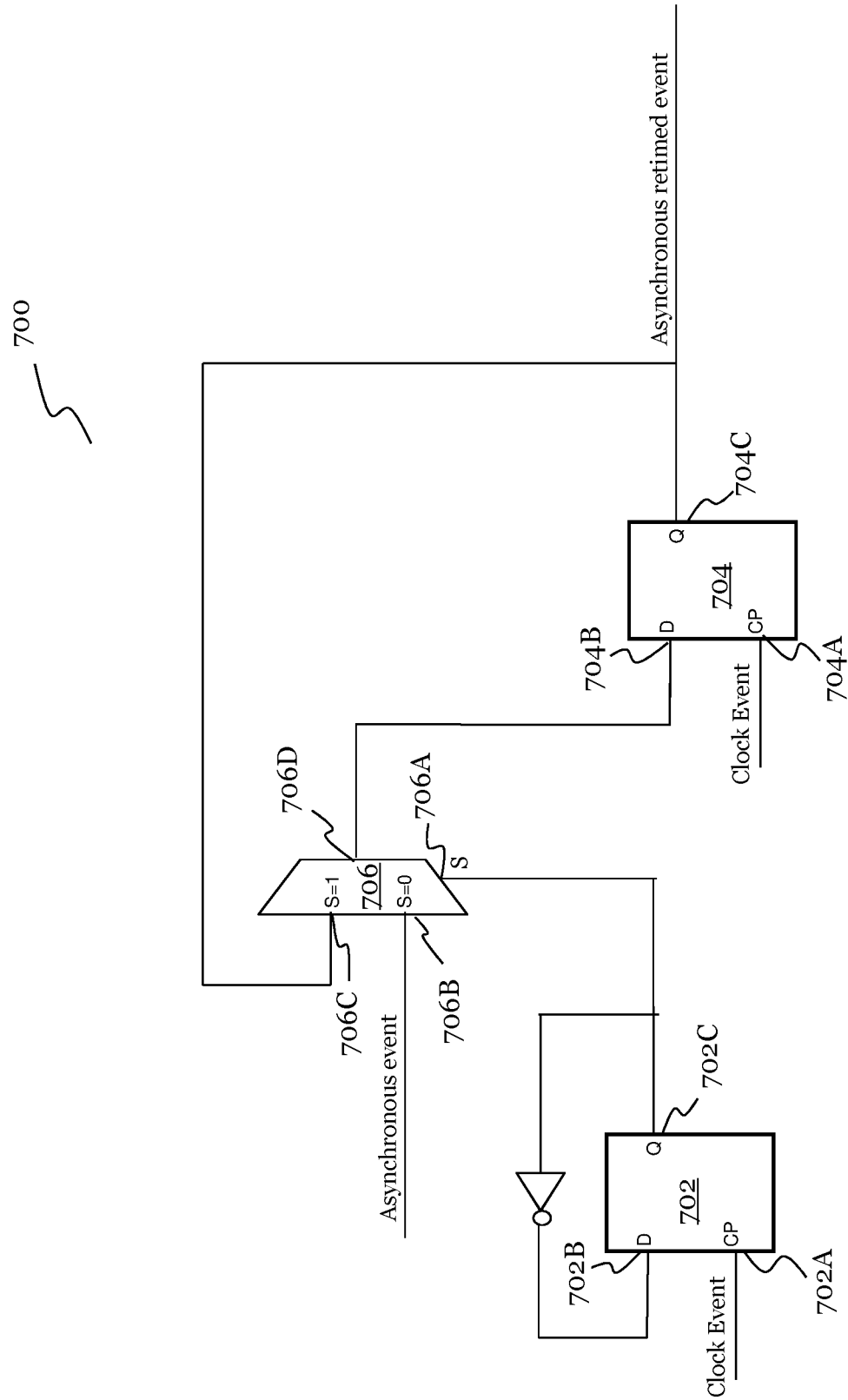
FIG. 7A depicts a circuit for synchronization of an asynchronous event signal in accordance with embodiments.

FIG. 7A depicts a circuit 700 for synchronization of an asynchronous event signal consistent with an embodiment.

As will be appreciated, the circuit 700 may be realized in a variety of different ways. FIG. 7 is provided for explanatory purposes but should not be construed to limit embodiments of the present disclosure.

The circuit 700 may comprise a first flip flop 702 and a second flip flop 704, both being configured to change states on the first active edge of a clock pulse. In various embodiments, the circuit 700 may further comprise a multiplexer 706.

A clock input 702A for the first flip flop 702 and a clock input 704A for the second flip flop 704 may receive a virtual clock event (for example, virtual-clock event 602). This may be accomplished by coupling the clock inputs with output 304B. The output 702C of the first flip flop 702 may be inverted and coupled with the input 702B of the first flip flop 702. The output 702C may also be coupled with the selection input 706A for the multiplexer 706. Thus, depending on the output of the first flip flop 702, the multiplexer 706 may toggle between a first input 706B and a second input 706C. For example, a "low" signal received at the selection input 706 may select the first input 706B and a "high" signal may select the second input 706C. The first input 706B may receive an asynchronous event signal (for example, a signal supplied to a first-state asynchronous event input 306F, a second-state asynchronous event input 306G(1), a second-state asynchronous event input 306G(2), third-state asynchronous event input 306H, and a fourth-state asynchronous event input 306I).

The second input 706C of the multiplexer may be coupled with the output 704C of the second flip flop 704. This signal may be referred to a retimed asynchronous event signal. The output 706D of the multiplexer 706 may be coupled with the input 704B of the second flip flop 704.

Figure 7B:
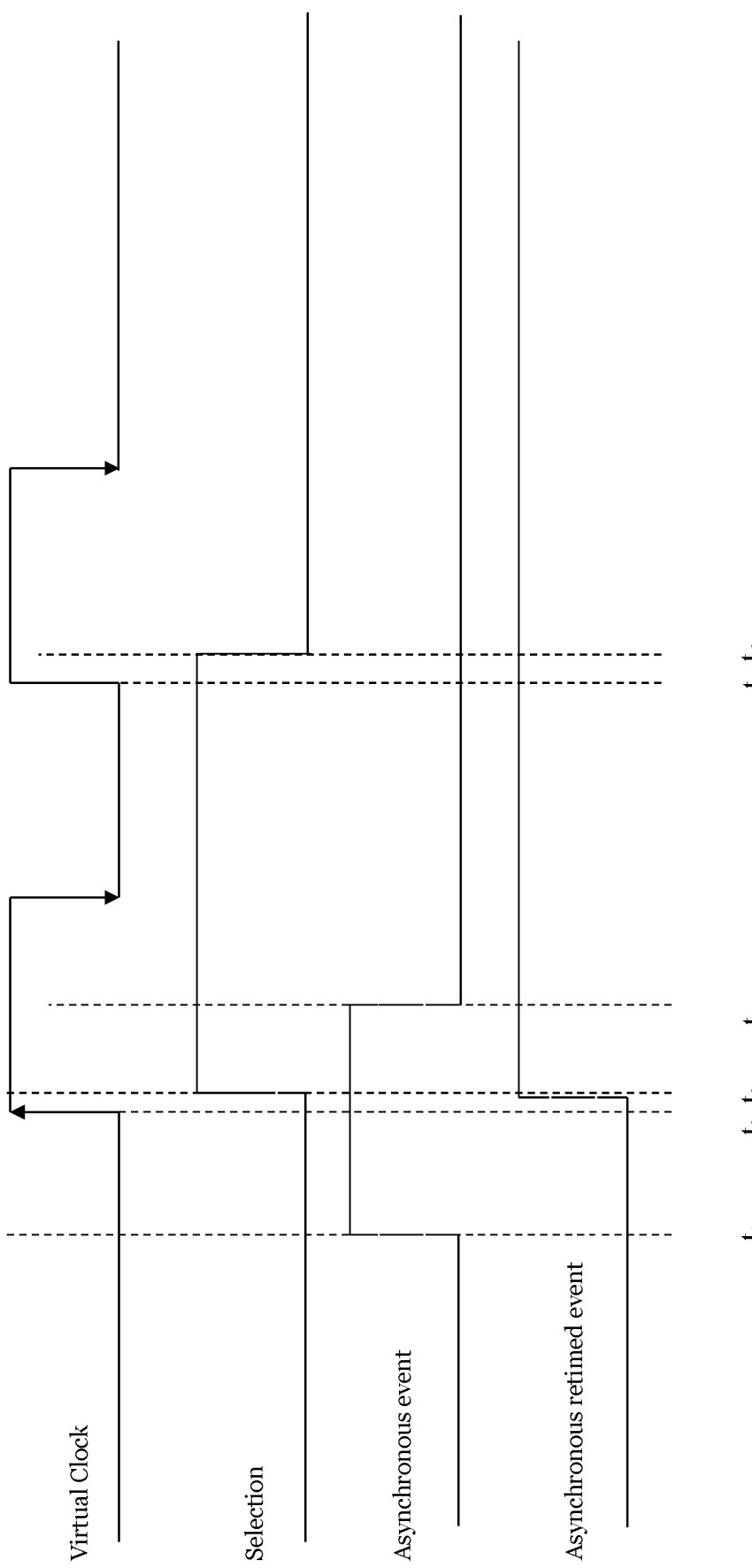
FIG. 7B depicts waveforms for circuit for synchronization of an asynchronous event signal in accordance with embodiments.

FIG. 7B depicts waveforms for circuit 700 for synchronization of an asynchronous event signal consistent with an embodiment.

Initially, the asynchronous event signal (the input for the first input 706B of the multiplexer), the clock-event signal (the clock input 702A and clock input 704A), the select signal (the output 702C), and a retimed asynchronous event signal (the output 704C) may all be low. Due to the value of the select signal, initially, the multiplexer 706 selects the first input 706B for its output 706D.

At time $t_1$, the asynchronous event signal may be asserted, which in turn may trigger a clock event double pulse with a first active edge occurring at time $t_2$. (for this example a rising edge). The output 702C of the first flip flop 702 and the output 704C of the second flip flop 704 may both shift high after a small propagation delay at time $t_3$. Also, due to the shift in the selection signal (due to the change in the output 702C) the output 706D of the multiplexer 706 may be toggled to propagate the signal received at the second input 706C.

At time $t_4$, the asynchronous event signal may go low. And, on the next active edge of the next pulse of the clock event, at time t5, the select signal may respond by going low at time $t_6$. However, the output 704C will remain stable because the multiplexer 706 will continue to propagate the second input 706C to the output 706D at time t5. This allows a retimed asynchronous event signal to become available (and stable) on the falling edge (the second-in-time active edge) of the first pulse of the clock event (the instant the FSM transition begins).

Figure 8:
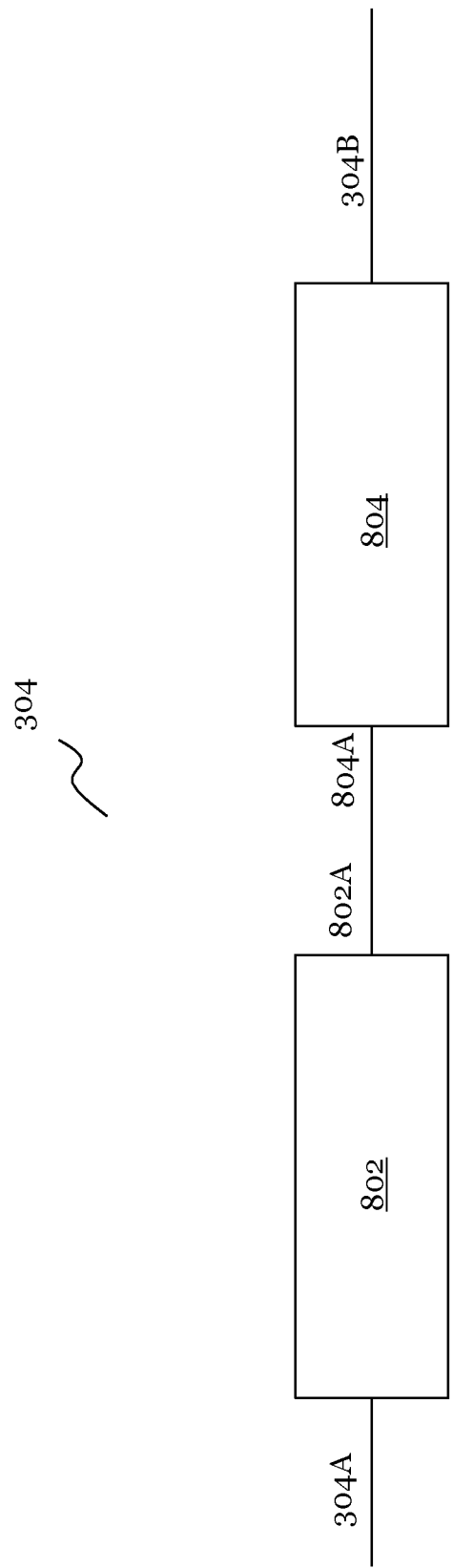
FIG. 8 depicts a virtual clock-pulse circuit consistent with an embodiment.

FIG. 8 depicts a virtual clock-pulse circuit 304 consistent with an embodiment.

As will be appreciated, the virtual clock-pulse circuit 304 may be realized in a variety of different ways. FIG. 8 is provided for explanatory purposes but should not be construed to limit embodiments of the present disclosure.

In various embodiments, the virtual clock-pulse circuit 304 may comprise a monostable block circuit 802. The monostable block circuit 802 may be used as a pulse generator. The monostable block circuit 802 may receive trigger-signal input 304A. And, the monostable block circuit 802 may provide an output 802A.

In various embodiments, the virtual clock-pulse circuit 304 may further comprise a pulse-doubling circuit 804. The pulse-doubling circuit 804 may receive a pulse from the monostable block circuit 802 and output a two virtual clock pulses at output 304B.

Figure 9:
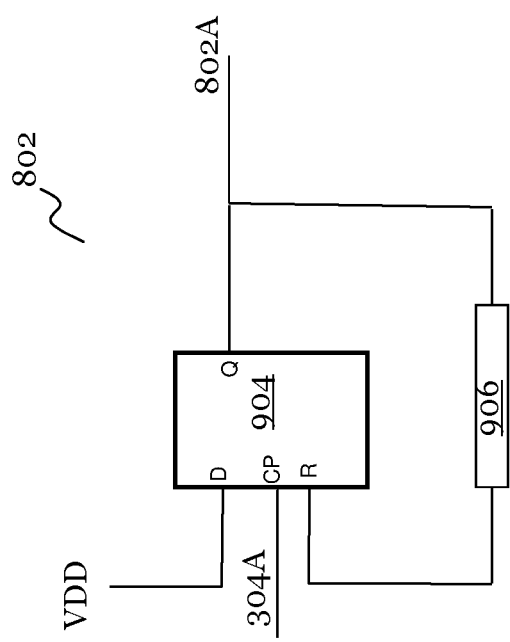
FIG. 9 depicts a monostable block consistent with an embodiment.

FIG. 9 depicts a monostable block circuit 802 consistent with an embodiment.

As will be appreciated, the monostable block circuit 802 may be realized in a variety of different ways. FIG. 9 is provided for explanatory purposes but should not be construed to limit embodiments of the present disclosure.

The monostable block circuit may receive a trigger signal at trigger-signal input 304A. This may be supplied to a flip flop 904. In response, the output will go high. The output 802A may coupled with a delay component 906. The delay component 906 may comprise any kind of logic gate(s) or combinational logic (for example, buffers or a number of inverters) useful to delay the flip flop 904 output signal.

After passing the delay component 906, the output of the delay component 906 provided to the reset of the flip flop 904, which will revert the output at 702A to a low state. The duration of the high pulse may be determined by delay introduced by the delay component 806 and propagation delay from the output of the flip flop 904 to the reset.

In various embodiments, the monostable block may be implemented using a flip flop that is set on a first active edge of the trigger signal. In such embodiments it may be required to return (reset) the trigger signal to zero to allow subsequent virtual clock-event generations. It thus may be advantageous to allow the asynchronous FSM 306 to transition through intermediate states during which all output states of the asynchronous FSM 306 supplied to the trigger circuit 302 are returned (reset) to zero. This may force the trigger signal to return to a de-asserted state, which puts the monostable block back in a condition to generate a new pulse.

In various embodiments, the trigger-signal input 304A may be coupled with a clock input for flip flop 904. The flip flop 904 may have a D input that receives another signal. The D input may be kept high when the asynchronous FSM system 300 is operating (for example, by coupling with VDD). In various embodiments, the flip flop 904 may be configured to be set on the rising edge of the clock pulse (since D is high). It may, thus, be advantageous to return the trigger-signal input 304A to zero to put the flip flop 904 in condition to generate additional pulses. As referenced in the preceding paragraphs, the asynchronous FSM 306 may comprise intermediate states where outputs transmitting the state of the asynchronous FSM 306 are set to zero (or at de-asserted), which may reset the trigger signal to zero (or de-asserted level).

Figure 10:
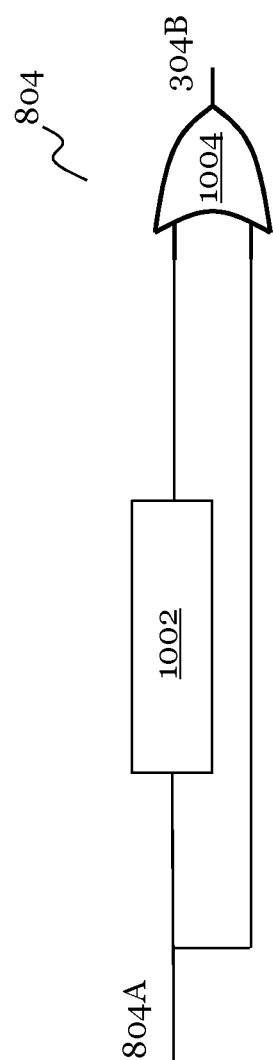
FIG. 10 depicts a pulse-doubling circuit consistent with an embodiment.

FIG. 10 depicts a pulse-doubling circuit 804 consistent with an embodiment.

The pulse-doubling circuit 804 may comprise an OR gate 1004 and a delay component 1002. An input 804A may be coupled with output 802A of the monostable block circuit 802. The delay implemented by delay component 1002 may be greater than the delay implemented by delay component 806 to produce two virtual-clock pulses at output 304B. FIG. 10 is provided for explanatory purposes but should not be construed to limit embodiments of the present disclosure.

Figure 11:
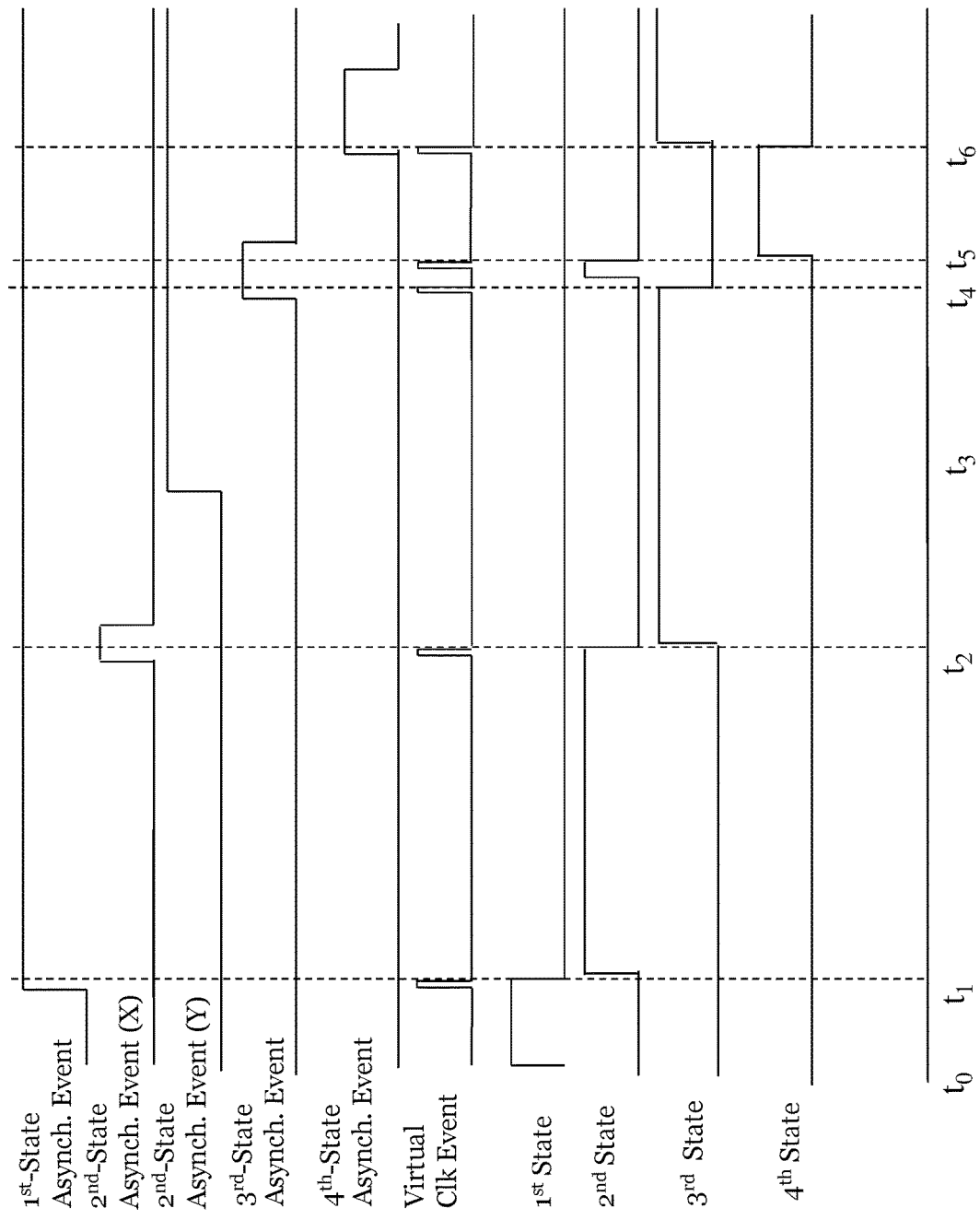
FIG. 11 depicts wave showing signals of an asynchronous FSM system in accordance with embodiments.

FIG. 11 depicts wave showing signals of an asynchronous FSM system 300 in accordance with embodiments.

FIG. 11 represents waveforms for a first-state asynchronous event input, a second-state asynchronous event input (X), a second-state asynchronous event input (Y), a third-state asynchronous event input, and a fourth-state asynchronous event input. FIG. 11 further depicts waveforms for a virtual-clock event signal, and output signals indicating the state of an asynchronous FSM 306 (a first state, a second state, a third state, and a fourth state). Pulses of the virtual-clock event signal may comprise two clock pulses that are not depicted for simplicity. The waveforms depicted in FIG. 11 may correspond to an asynchronous FSM 306 with states as depicted in FIG. 5.

At a time $t_0$, the asynchronous FSM 306 is in a first state 502. Accordingly, the first state waveform is high. At a time $t_1$, the first-state asynchronous event signal waveform is asserted. This may prompt the trigger circuit 302 to produce a trigger signal, which in turn may cause the virtual clock-pulse circuit 304 to generate a virtual-clock event (note that FIG. 11 only depicts a single pulse, however it may represent a double virtual-clock pulse). The asynchronous FSM 306 may transition into a second state 506 in response to the virtual-clock event at time $t_1$. Accordingly, the second state waveform is asserted and the first state waveform is de-asserted. The asynchronous FSM 306 may transition to an intermediate state 504 (not shown in FIG. 11) between the first state and the second state to allow a return to zero of the trigger signal.

At a time $t_2$, a second-state asynchronous event occurs. This may cause the trigger circuit 302 to generate a trigger signal that cause a virtual-clock event. Because the first second-state event (X) signal was asserted, the asynchronous FSM 306 may transition to third state 512. And, the third state signal may go be asserted. The second state signal may be de-asserted. Again, the asynchronous FSM 306 may transition to intermediate state 508 (not shown in FIG. 11) before transitioning to the third state 512.

At a time $t_3$, the second second-state asynchronous event (Y) may go high. However, the asynchronous FSM 306 is in the third state (not the second state) at this time so the asynchronous FSM 306 may not trigger a virtual-clock event and no transition will occur.

At a time $t_4$, the third-state asynchronous event may be asserted. The trigger circuit 302 may produce a trigger and the virtual clock-pulse circuit 304 may generate a virtual-clock event. The asynchronous FSM 306 may then transition back to the second state 506. The second state signal may be asserted and third state signal de-asserted. And, in various embodiments, the asynchronous FSM 306 may transition into intermediate state 516 (not shown in FIG. 11) before transitioning to the second state 506 to allow a return to zero.

At a time $t_5$, a virtual-clock event may be triggered by the trigger circuit 302. The second-state asynchronous signal (Y) remained high after $t_3$, so the trigger circuit 302 may produce a trigger signal as soon as asynchronous FSM 306 enters the second state 506. The asynchronous FSM 306 may then transition to the fourth state 514. And, the fourth state signal may be asserted. The second state signal may be de-asserted. The asynchronous FSM 306 may transition to the intermediate state 510 (not shown in FIG. 11) between the second state 506 and the fourth state 514.

At a time $t_0$, the fourth-state asynchronous event may be asserted. This may cause the trigger circuit 302 to produce a trigger signal, which may cause the virtual clock-pulse circuit 304 to generate a virtual-clock event. The asynchronous FSM 306 may then transition to the third state 512 from the fourth state 514. The third state signal may be asserted and the fourth state signal may be de-asserted. In various embodiments, the asynchronous FSM 306 may transition to the intermediate state 508 (not shown in FIG. 11) before transitioning to the third state 512 from the fourth state 514.

In various embodiments, it may be advantageous to include a digital de-glitch block circuit in the asynchronous FSM 306 between the trigger circuit 302 and the virtual clock-pulse circuit 304. This may be desirable to avoid propagation of metastable conditions on the output 802A of the monostable block circuit 802 due to glitch generation on 302E signal.

Figure 12:
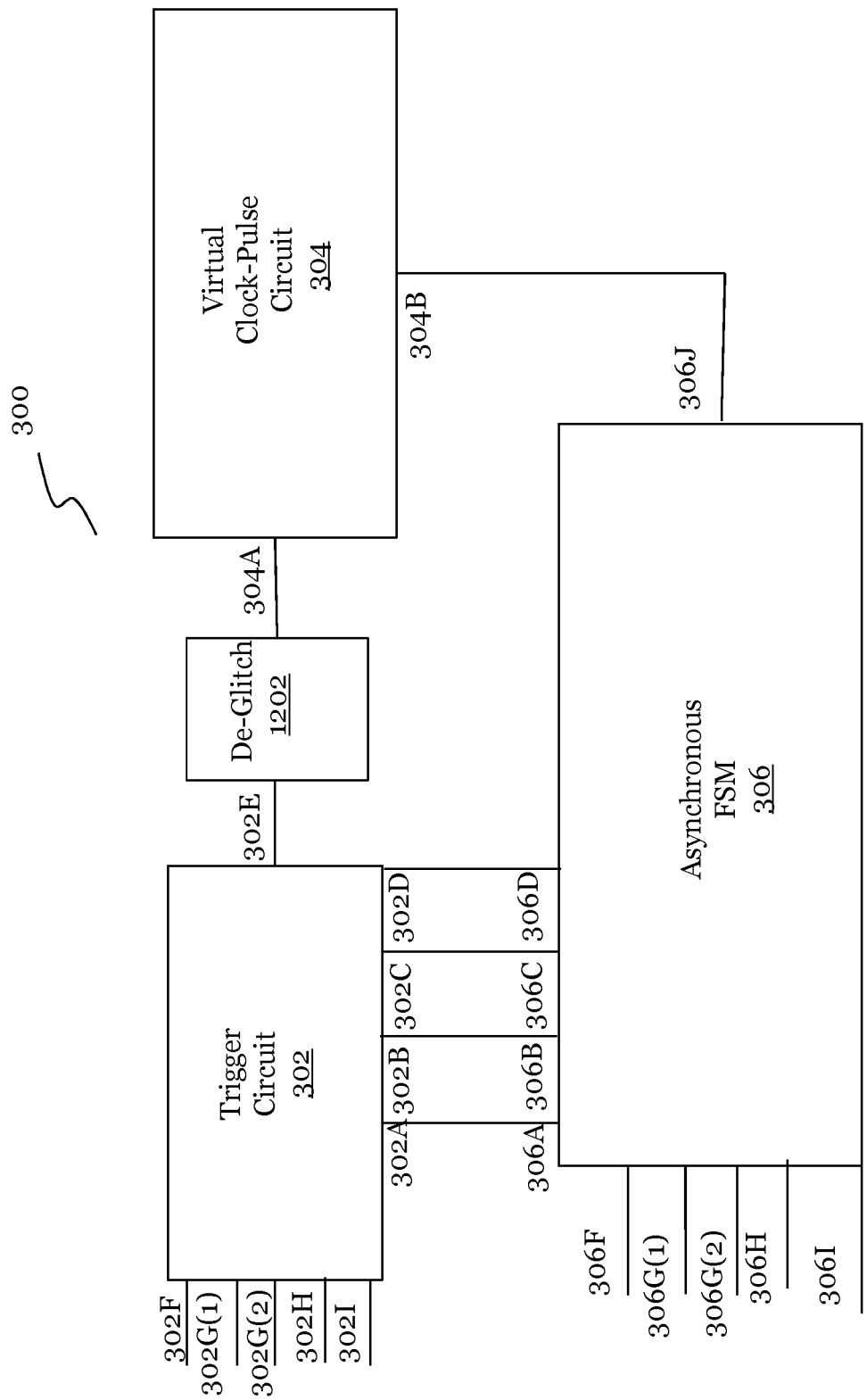
FIG. 12 depicts an asynchronous FSM 306 comprising a de-glitch block in accordance with an embodiment.

FIG. 12 depicts an asynchronous FSM 306 comprising a de-glitch block in accordance with an embodiment.

As depicted in FIG. 12, a de-glitch block 1202 may receive trigger-signal output 302E at an input and output to trigger-signal input 304A. The de-glitch block may comprise a C-element and other element know to remove instability from a signal.

The asynchronous FSM 306 may allow many of the advantages of traditional asynchronous FSMs in combination with advantages offered by synchronous FSMs. The asynchronous FSM 306 may be implemented using standard library cells. It may allow description by VHDL, use of CAD tools for synthesis and Automatic Test Pattern Generation. It may improve the power consumption and speed of a synchronous FSM. It also may allow better EMI performance than a synchronous FSM.

Figure 13:
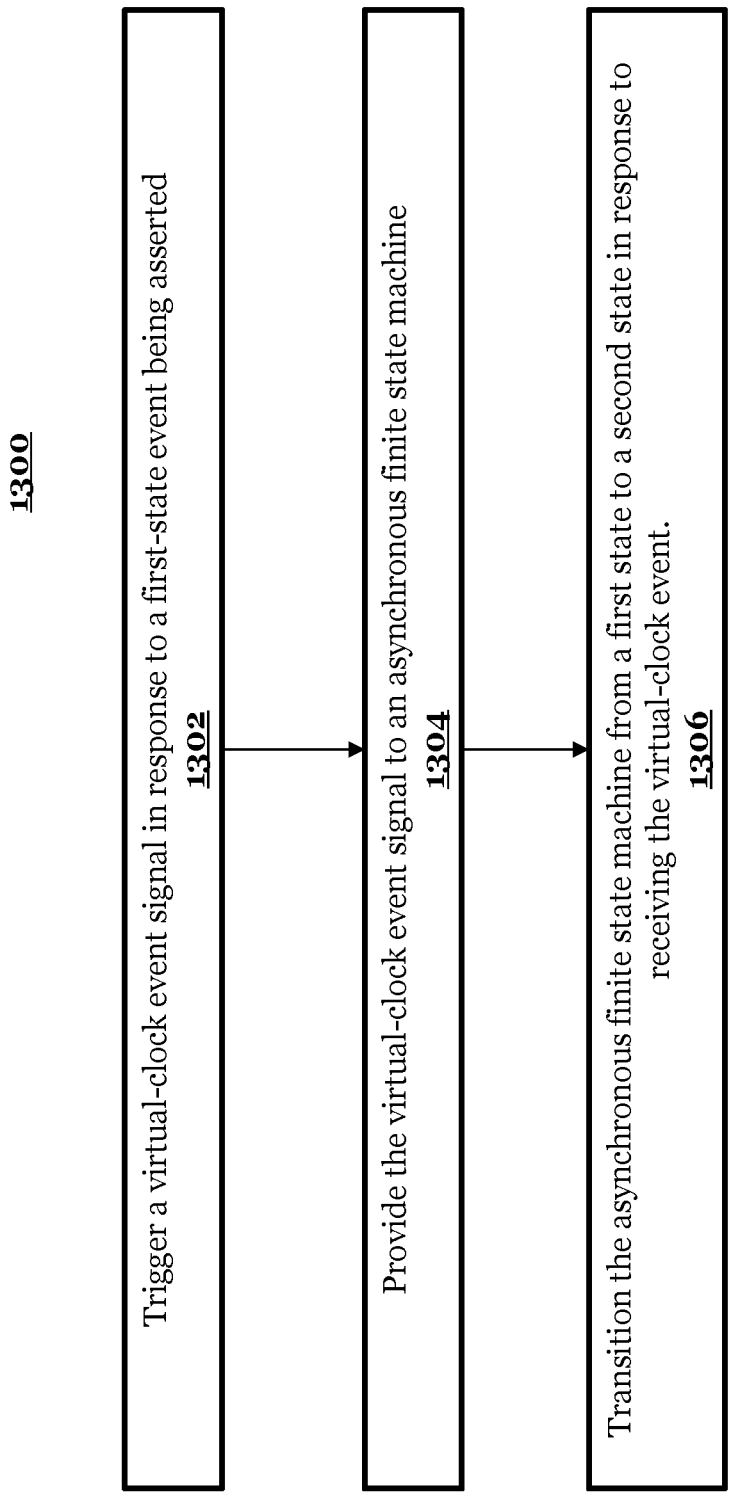
FIG. 13 illustrates a method consistent with embodiments.

FIG. 13 illustrates a method 1300 consistent with embodiments.

In various embodiments, the method 1300 may comprise at a step 1302, triggering a virtual-clock event in response to a first-state asynchronous event signal being asserted; at a step 1304, providing the virtual-clock event to an asynchronous finite state machine; and, at a step 1306, transitioning the asynchronous finite state machine from a first state to a second state in response to receiving the virtual-clock event.

In various embodiments, the method 1300 may further comprise, wherein transitioning the asynchronous finite state machine from the first state to the second state comprises transitioning the asynchronous finite state machine from the first state to an intermediate state and transitioning the asynchronous finite state machine from the intermediate state to the second state.

In various embodiments, the method 1300 may further comprise, wherein providing the virtual-clock event to the asynchronous finite state machine comprises providing a first pulse to the asynchronous finite state machine and providing a second pulse to the asynchronous finite state machine.

In various embodiments, the method 1300 may further comprise, wherein a falling edge of the first pulse prompts the asynchronous finite state machine to transition from the first state to the intermediate state and a falling edge of the second pulse prompts the asynchronous finite state machine to transition from the intermediate state to the second state.

In various embodiments, the method 1300 may further comprise triggering a second virtual-clock event in response to receiving a second-state asynchronous event signal, the virtual-clock event comprising a first pulse and a second pulse; providing the second virtual-clock event to the asynchronous finite state machine; and transitioning the asynchronous finite state machine from the second state to a third state in response to receiving the virtual-clock event.

Example 1. A system includes an asynchronous finite state machine configured to transition from a first state to a second state in response to receiving a virtual-clock event; a trigger circuit including a first-state asynchronous event input to receive a first-state asynchronous event signal, the trigger circuit configured to communicate with the asynchronous finite state machine and assert a trigger signal in response to the first-state asynchronous event signal being asserted while the asynchronous finite state machine is in the first state; and a virtual clock-pulse circuit configured to receive the trigger signal and generate the virtual-clock event in response to the trigger signal being asserted.

Example 2. The system of Example 2 wherein, the asynchronous finite state machine is configured to transition from the second state to a third state in response to receiving the virtual-clock event and wherein the trigger circuit includes a second-state asynchronous event input to receive a second-state asynchronous event signal, the trigger circuit being configured to assert the trigger signal in response to the second-state asynchronous event signal being asserted while the asynchronous finite state machine is in the second state.

Example 3. The system of Example 2 or Example 1 wherein, trigger circuit includes a multiplexer that includes an output coupled with the virtual clock-pulse circuit to deliver the trigger signal, and a selection input that is coupled with an output of the asynchronous finite state machine, the trigger circuit being configured to provide the first-state asynchronous event signal to the output of the trigger circuit when the asynchronous finite state machine is in the first state and to provide the second-state asynchronous event signal to the output of the trigger circuit when the asynchronous finite state machine is in the second state.

Example 4. The system of Example 1 through Example 3 wherein, the virtual-clock event includes a first pulse and a second pulse.

Example 5. The system of Example 1 through Example 4 wherein, the asynchronous finite state machine is configured to transition from the first state to the second state in response to receiving the virtual-clock event by transitioning from the first state to an intermediate state on receiving the first pulse and transition from the intermediate state to the second state on receiving the second pulse.

Example 6. The system of Example 1 through Example 5 wherein, the trigger circuit is configured so that the trigger signal is de-asserted when the asynchronous finite state machine is in the intermediate state.

Example 7. The system of Example 1 through Example 6 wherein, the asynchronous finite state machine is configured to transition from the first state to the intermediate state on receiving a second-in-time active edge of the first pulse and configured to transition from the intermediate state to the second state on receiving a second-in-time active edge of the second pulse.

Example 8. The system of Example 1 through Example 7 wherein, the virtual clock-pulse circuit includes a monostable circuit to generate the first pulse and a pulse doubling circuit to generate the second pulse.

Example 9. The system of Example 1 through Example 8 wherein, the system further includes a de-glitch circuit including an input coupled with an output of the triggering circuit, the de-glitch circuit including an output coupled with the virtual clock-pulse circuit.

Example 10. A method includes triggering a virtual-clock event in response to a first-state asynchronous event signal being asserted; providing the virtual-clock event to an asynchronous finite state machine; and transitioning the asynchronous finite state machine from a first state to a second state in response to receiving the virtual-clock event.

Example 11. The method of Example 10 wherein, transitioning the asynchronous finite state machine from the first state to the second state includes transitioning the asynchronous finite state machine from the first state to an intermediate state and transitioning the asynchronous finite state machine from the intermediate state to the second state.

Example 12. The method of Example 10 or Example 11 wherein, providing the virtual-clock event to the asynchronous finite state machine includes providing a first pulse to the asynchronous finite state machine and providing a second pulse to the asynchronous finite state machine.

Example 13. The method of Example 10 through Example 12 wherein, a second-in-time active edge of the first pulse prompts the asynchronous finite state machine to transition from the first state to the intermediate state and a second-in-time active edge of the second pulse prompts the asynchronous finite state machine to transition from the intermediate state to the second state.

Example 14. The method of Example 10 through Example 13, the method further includes triggering a second virtual-clock event in response to receiving a second-state asynchronous event signal, the virtual-clock event including a first pulse and a second pulse; providing the second virtual-clock event to the asynchronous finite state machine; and transitioning the asynchronous finite state machine from the second state to a third state in response to receiving the virtual-clock event.

Example 15. A system includes an asynchronous finite state machine configured to transition from a first state to a first intermediate state in response to receiving a first pulse of a virtual-clock event while in the first state, transition from the first intermediate state to a second state in response to receiving a second pulse of the virtual-clock event while in the first intermediate state, transition from the second state to a second intermediate state in response to receiving the first pulse of the virtual-clock event while in the second state, and transition from the second intermediate state to a third state in response to receiving the second pulse of the virtual-clock event while in the second intermediate state. The system further including a trigger circuit including a first-state asynchronous event input to receive a first-state asynchronous event signal and a second-state asynchronous event input to receive a second-state asynchronous event signal, the trigger circuit configured to communicate with the asynchronous finite state machine and to assert a trigger signal in response to the first-state asynchronous event signal being asserted while the asynchronous finite state machine is in the first state and the trigger circuit being configured to assert the trigger signal when the second-state asynchronous event signal is asserted while the asynchronous finite state machine is in the second state; and a virtual clock-pulse circuit configured to receive the trigger signal and generate the virtual-clock event in response to the trigger signal being asserted.

Example 16. The system of Example 15, the trigger circuit is configured so that the trigger signal is de-asserted when the asynchronous finite state machine is in the first intermediate state, and the trigger circuit being configured so that the trigger signal is de-asserted when the asynchronous finite state machine is in the second intermediate state.

Example 17. The system of Example 15 through Example 16, the asynchronous finite state machine is configured to transition from the first state to the first intermediate state on receiving a second-in-time active edge of the first pulse and transition from the first intermediate state to the second state on receiving a second-in-time active edge of the second pulse.

Example 18. The system of Example 15 through Example 17, the asynchronous finite state machine is configured to transition from the second state to the second intermediate state on receiving a second-in-time active edge of the first pulse and transition from the second intermediate state to the third state on receiving the second-in-time active edge of the second pulse.

Example 19. The system of Example 15 through Example 18, the virtual clock-pulse circuit includes a monostable circuit to generate the first pulse and a pulse-doubling circuit to generate the second pulse.

Example 20. The system of Example 15 through Example 19, the system further includes a de-glitch circuit including an input coupled with an output of the triggering circuit, the de-glitch circuit including an output coupled with the virtual clock-pulse circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
    a clockless trigger circuit comprising a first-state asynchronous event input to receive a first-state asynchronous event signal, and a second-state asynchronous event input to receive a second-state asynchronous event signal, wherein the clockless trigger circuit is configured to:
        assert a first trigger signal in response to the first-state asynchronous event signal being asserted while an asynchronous finite state machine is in a first state; and
        assert a second trigger signal in response to the second-state asynchronous event signal being asserted while the asynchronous finite state machine is in a second state;
    a clockless virtual clock-pulse circuit coupled to the clockless trigger circuit, and configured to:
        receive the first trigger signal and generate a first virtual-clock event in response to the first trigger signal being asserted; and
        receive the second trigger signal and generate a second virtual-clock event in response to the second trigger signal being asserted; and
    the asynchronous finite state machine, coupled to the clockless trigger circuit and the clockless virtual clock-pulse circuit, and configured to:
        generate a retimed first-state asynchronous event signal in response to receiving the first-state asynchronous event signal and the first virtual-clock event;
        transition from the first state to the second state in response to the retimed first-state asynchronous event signal and to the first virtual-clock event; and
        generate a retimed second-state asynchronous event signal in response to receiving the second-state asynchronous event signal and the second virtual-clock event; and
        transition from the second state to a third state in response to the retimed second-state asynchronous event signal and to the second virtual-clock event.

2. The system of claim 1, wherein the clockless trigger circuit comprises a multiplexer that comprises an output coupled with the clockless virtual clock-pulse circuit to deliver the first and second trigger signals, and a selection input that is coupled with an output of the asynchronous finite state machine, the clockless trigger circuit being configured to provide the first-state asynchronous event signal to the output of the clockless trigger circuit when the asynchronous finite state machine is in the first state and to provide the second-state asynchronous event signal to the output of the clockless trigger circuit when the asynchronous finite state machine is in the second state.

3. The system of claim 1, wherein the first virtual-clock event comprises a first pulse and a second pulse.

4. The system of claim 3, wherein the asynchronous finite state machine is configured to transition from the first state to the second state by transitioning from the first state to an intermediate state after receiving the first pulse and transition from the intermediate state to the second state after receiving the second pulse.

5. The system of claim 4, wherein the clockless trigger circuit is configured so that the first trigger signal is de-asserted when the asynchronous finite state machine is in the intermediate state.

6. The system of claim 4, wherein the asynchronous finite state machine is configured to transition from the first state to the intermediate state on receiving a second-in-time active edge of the first pulse and configured to transition from the intermediate state to the second state on receiving a second-in-time active edge of the second pulse.

7. The system of claim 3 wherein the clockless virtual clock-pulse circuit comprises:
    a monostable circuit to generate the first pulse; and
    a pulse doubling circuit to generate the second pulse.

8. The system of claim 1, further comprising a de-glitch circuit comprising:
    an input coupled with an output of the clockless trigger circuit; and
    an output coupled with the clockless virtual clock-pulse circuit.

9. The system of claim 1, wherein the second virtual-clock event comprises a first pulse of the second virtual-clock event and a second pulse of the second virtual-clock event.

10. A method comprising:
    triggering, by a clockless trigger circuit, a first trigger signal in response to a first-state asynchronous event signal being asserted;
    providing, by a clockless virtual clock-pulse circuit, a first virtual-clock event to an asynchronous finite state machine;
    generating, by the asynchronous finite state machine, a retimed first-state asynchronous event signal in response to receiving a first pulse of the first virtual-clock event and a first-state event signal;
    transitioning the asynchronous finite state machine from a first state to a second state in response to the retimed first-state asynchronous event signal and to the first virtual-clock event;
    triggering, by the clockless trigger circuit, a second trigger signal in response to receiving a second-state asynchronous event signal;
    providing, by the clockless virtual clock-pulse circuit, a second virtual-clock event to the asynchronous finite state machine;
    generating, by the asynchronous finite state machine, a retimed second-state asynchronous event signal in response to receiving a first pulse of the second virtual-clock event and the second-state asynchronous event signal; and transitioning the asynchronous finite state machine from the second state to a third state in response to the retimed second-state asynchronous event signal and to the second virtual-clock event.

11. The method of claim 10, wherein transitioning the asynchronous finite state machine from the first state to the second state comprises:

transitioning the asynchronous finite state machine from the first state to an intermediate state; and transitioning the asynchronous finite state machine from the intermediate state to the second state.

12. The method of claim 11, wherein providing the first virtual-clock event to the asynchronous finite state machine comprises:

providing the first pulse of the first virtual-clock event to the asynchronous finite state machine; and providing a second pulse of the first virtual-clock event to the asynchronous finite state machine.

13. The method of claim 12, further comprising:

transitioning the asynchronous finite state machine from the first state to the intermediate state in response to a second-in-time active edge of the first pulse of the first virtual-clock event; and transitioning the asynchronous finite state machine from the intermediate state to the second state in response to a second-in-time active edge of the second pulse of the first virtual-clock event.

14. The method of claim 10, wherein transitioning the asynchronous finite state machine from the second state to the third state comprises:

transitioning the asynchronous finite state machine from the second state to an intermediate state; and transitioning the asynchronous finite state machine from the intermediate state to the third state.

15. The method of claim 14, wherein providing the second virtual-clock event to the asynchronous finite state machine comprises providing first and second pulses of the second virtual-clock event to the asynchronous finite state machine, and the method further comprises:

transitioning the asynchronous finite state machine from the second state to the intermediate state in response to a second-in-time active edge of the first pulse of the second virtual-clock event; and transitioning the asynchronous finite state machine from the intermediate state to the third state in response to a second-in-time active edge of the second pulse of the second virtual-clock event.

16. A system comprising:

a clockless trigger circuit comprising a first-state asynchronous event input to receive a first-state asynchronous event signal, and a second-state asynchronous event input to receive a second-state asynchronous event signal, wherein the clockless trigger circuit is configured to:

assert a first trigger signal in response to the first-state asynchronous event signal being asserted while an asynchronous finite state machine is in a first state; and assert a second trigger signal when the second-state asynchronous event signal is asserted while the asynchronous finite state machine is in a second state;

a clockless virtual clock-pulse circuit coupled to the clockless trigger circuit, and configured to receive the first and second trigger signals and generate first and second virtual-clock events in response to the first and second trigger signals, respectively, being asserted; and the asynchronous finite state machine, coupled to the clockless trigger circuit and the clockless virtual clock-pulse circuit, and configured to:

generate a retimed first-state asynchronous event signal in response to receiving a first pulse of the first virtual-clock event while in the first state;

transition from the first state to a first intermediate state in response to the retimed first-state asynchronous event signal;

transition from the first intermediate state to the second state in response to receiving a second pulse of the first virtual-clock event while in the first intermediate state;

generate a retimed second-state asynchronous event signal in response to receiving a first pulse of the second virtual-clock event while in the second state;

transition from the second state to a second intermediate state in response to the retimed second-state asynchronous event signal; and transition from the second intermediate state to a third state in response to receiving a second pulse of the second virtual-clock event while in the second intermediate state.

17. The system of claim 16, wherein the clockless trigger circuit is configured to:

de-assert the first trigger signal when the asynchronous finite state machine is in the first intermediate state; and de-assert the second trigger signal when the asynchronous finite state machine is in the second intermediate state.

18. The system of claim 16, wherein the asynchronous finite state machine is configured to:

transition from the first state to the first intermediate state on receiving a second-in-time active edge of the first pulse of the first virtual-clock event; and transition from the first intermediate state to the second state on receiving a second-in-time active edge of the second pulse of the first virtual-clock event.

19. The system of claim 16, wherein the asynchronous finite state machine is configured to:

transition from the second state to the second intermediate state on receiving a second-in-time active edge of the first pulse of the second virtual-clock event; and transition from the second intermediate state to the third state on receiving the second-in-time active edge of the second pulse of the second virtual-clock event.

20. The system of claim 16, wherein the clockless virtual clock-pulse circuit comprises:

a monostable circuit configured to generate the first pulses of the first and second virtual-clock events; and a pulse-doubling circuit to generate the second pulses of the first and second virtual-clock events.

21. The system of claim 16, further comprising a de-glitch circuit comprising:

an input coupled with an output of the clockless trigger circuit; and an output coupled with the clockless virtual clock-pulse circuit.

* * * * *